US009496016B2

United States Patent
Lee et al.

(10) Patent No.: US 9,496,016 B2
(45) Date of Patent: Nov. 15, 2016

(54) MEMORY CELL AND MEMORY DEVICE HAVING THE SAME

(71) Applicant: Samsung Electronics Co., Ltd., Suwon-si, Gyeonggi-do (KR)

(72) Inventors: Choong-Jae Lee, Hwaseong-si (KR); Kyoung-Mok Son, Suwon-si (KR); Sang-Gi Ko, Seongnam-si (KR); Si-Woo Kim, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 199 days.

(21) Appl. No.: 14/083,569

(22) Filed: Nov. 19, 2013

(65) Prior Publication Data
US 2014/0198560 A1    Jul. 17, 2014

(30) Foreign Application Priority Data

Jan. 16, 2013 (KR) ........................ 10-2013-0004661

(51) Int. Cl.
*G11C 11/403* (2006.01)
*G11C 8/16* (2006.01)
*H01L 27/108* (2006.01)
*H01L 27/115* (2006.01)

(52) U.S. Cl.
CPC ............... *G11C 8/16* (2013.01); *G11C 11/403* (2013.01); *H01L 27/10805* (2013.01); *H01L 27/1156* (2013.01)

(58) Field of Classification Search
CPC .................................. G11C 11/403; G11C 8/16
USPC ............................................................. 365/149
See application file for complete search history.

(56) References Cited

U.S. PATENT DOCUMENTS

| | | |
|---|---|---|
| 4,970,689 A | 11/1990 | Kenney |
| 5,646,903 A | 7/1997 | Johnson |
| 5,909,400 A | 6/1999 | Bertin et al. |
| 5,943,270 A | 8/1999 | Borkar |
| 5,978,301 A * | 11/1999 | Maeno ............... H01L 27/11807 257/E27.081 |
| 5,995,433 A | 11/1999 | Liao |
| 6,016,268 A * | 1/2000 | Worley ................. G11C 11/565 365/149 |
| 6,421,265 B1 | 7/2002 | Lien et al. |
| 6,671,210 B2 | 12/2003 | Watanabe et al. |
| 6,680,864 B2 | 1/2004 | Noble |
| 6,744,654 B2 | 6/2004 | Loughmiller |
| 6,809,979 B1 | 10/2004 | Tang |
| 6,831,866 B1 | 12/2004 | Kirihata |
| 6,949,782 B2 | 9/2005 | Atwood et al. |
| 7,016,211 B2 | 3/2006 | Park et al. |
| 7,038,943 B2 | 5/2006 | Kaal |
| 7,123,500 B2 | 10/2006 | Ye et al. |
| 7,139,214 B2 | 11/2006 | Atwood et al. |
| 7,151,690 B2 | 12/2006 | Forbes |
| 7,440,334 B2 | 10/2008 | Barth et al. |

(Continued)

*Primary Examiner* — Son Mai
*Assistant Examiner* — Muna A Techane
(74) *Attorney, Agent, or Firm* — Lee & Morse, P.C.

(57) ABSTRACT

A memory cell includes a metal oxide semiconductor (MOS) capacitor including a gate coupled to a storage node and an electrode coupled to a synchronization control line. The MOS capacitor adds a coupling voltage to the gate based on a change in voltage on the synchronization control line. The coupling voltage may maintain the storage node within a predetermined range.

15 Claims, 19 Drawing Sheets

(56) References Cited

U.S. PATENT DOCUMENTS

| | | |
|---|---|---|
| 7,459,743 B2 | 12/2008 | Mandelman et al. |
| 2005/0047256 A1* | 3/2005 | Yang ........................ G11C 8/16 |
| | | 365/230.05 |
| 2010/0329043 A1 | 12/2010 | Fossum et al. |
| 2011/0194331 A1* | 8/2011 | Kawae .................. G11C 11/405 |
| | | 365/149 |
| 2012/0063202 A1 | 3/2012 | Houston et al. |
| 2012/0213000 A1* | 8/2012 | Takemura ............. H01L 27/108 |
| | | 365/174 |

* cited by examiner

MEMORY CELL AND MEMORY DEVICE HAVING THE SAME

CROSS-REFERENCE TO RELATED APPLICATION

Korean Patent Application No. 10-2013-0004661, filed on Jan. 16, 2013, and entitled, "Memory Cell and Memory Device Having the Same," is incorporated by reference herein in its entirety.

BACKGROUND

1. Field

One or more embodiments described herein relate to a semiconductor device.

2. Description of the Related Art

Various types of random access memories have been developed. One type, known as a static random access memory (SRAM), has cells of excessive size. The excessive cell size is attributable, at least in part, due to the use of six transistors. Using large size cells is considered undesirable as the overall density of the SRAM is reduced.

Another type of random access memory is known as a logic-compatible embedded dynamic random access memory (DRAM). In this type of memory, a refresh period is relatively short since a data retention time in each cell is relatively short. In addition, since a destructive readout is performed during a read operation of a DRAM cell, a refresh operation is required every time the read operation is performed.

SUMMARY

In accordance with one embodiment, a memory cell includes a write transistor including a gate electrode coupled to a write word line, a first electrode coupled to a write bit line, and a second electrode coupled to a storage node; a read transistor including a gate electrode coupled to the storage node, a first electrode coupled to a read word line and a second electrode coupled to a read bit line; and a metal oxide semiconductor (MOS) capacitor including a gate electrode coupled to the storage node and a lower electrode coupled to a synchronization control line, the lower electrode coupled to receive a synchronization pulse signal through the synchronization control line.

Also, the synchronization pulse signal may be applied to the synchronization control line in a write operation. The synchronization pulse signal may be applied to the synchronization control line in synchronization with a write word line signal applied to the write word line.

Also, the synchronization pulse signal may be applied to the synchronization control line in a read operation. The synchronization pulse signal may be applied to the synchronization control line in synchronization with a read word line signal applied to the read word line. The write transistor and the read transistor may be p-type MOS transistors.

Also, in a write operation, a write word line signal activated at a logic low level is applied to the write word line and the synchronization pulse signal is activated at the logic low level in synchronization with the write word line signal.

Also, in a read operation, a read word line signal activated at a logic high level is applied to the read word line and the synchronization pulse signal is activated at a logic low level in synchronization with the read word line signal.

Also, the write transistor may be a p-type MOS transistor and the read transistor is an n-type MOS transistor. In a write operation, a write word line signal activated at a logic low level is applied to the write word line, and the synchronization pulse signal is: a) maintained at a first level between a logic high level and the logic low level before the write word line signal is activated at the logic low level, and b) activated at the logic low level in synchronization with the write word line signal.

Also, in a write operation, a write word line signal activated at a logic low level is applied to the write word line, and the synchronization pulse signal is: a) maintained at a first level between a logic high level and the logic low level, b) changes to the logic high level before the write word line signal is activated at the logic low level, and c) activated at the logic low level in synchronization with the write word line signal.

Also, in a read operation, a read word line signal activated at a logic low level is applied to the read word line, and the synchronization pulse signal is: a) maintained at a first level between a logic high level and the logic low level before the read word line signal is activated at the logic low level, and b) activated at the logic high level in synchronization with the read word line signal.

Also, the MOS capacitor includes one impurity region in a first direction along an edge of the memory cell, the one impurity region corresponding to the lower electrode.

Also, the gate electrode of the read transistor and the gate electrode of the MOS capacitor may be integrally formed as one common electrode, and the one common electrode includes a region that overlaps the one impurity region along the first direction. The one common electrode may be electrically connected to the second electrode of the write transistor through a shared contact.

In accordance with another embodiment, a memory cell includes a write transistor including a gate electrode coupled to a write word line, a first electrode coupled to a write bit line, and a second electrode coupled to a storage node; a read transistor including a gate electrode coupled to the storage node, a first electrode coupled to a read word line, and a second electrode; a read switch transistor including a gate electrode coupled to the read word line, a first electrode coupled to the second electrode of the read transistor, and a second electrode coupled to a read bit line; and a metal oxide semiconductor (MOS) capacitor including a gate electrode coupled to the storage node and a lower electrode coupled to a synchronization control line, the lower electrode coupled to receive a synchronization pulse signal through the synchronization control line.

Also, the write transistor, the read transistor, and the read switch transistor may be p-type MOS transistors. In a write operation, a write word line signal activated at a logic low level is applied to the write word line and the synchronization pulse signal is activated at the logic low level in synchronization with the write word line signal. In a read operation, a read word line signal activated at a logic low level is applied to the read word line and the synchronization pulse signal is activated at the logic low level in synchronization with the read word line signal.

Also, the write transistor may be a p-type MOS transistor and the read transistor and the read switch transistor may be n-type MOS transistors. In a write operation, a write word line signal activated at a logic low level is applied to the write word line, and the synchronization pulse signal is: a) maintained at a first level between a logic high level and the logic low level before the write word line signal is activated at the logic low level, and b) activated at the logic low level in synchronization with the write word line signal.

Also, in a write operation, a write word line signal activated at a logic low level is applied to the write word line, and the synchronization pulse signal is: a) maintained at a first level between a logic high level and the logic low level, b) changes to the logic high level before the write word line signal is activated at the logic low level, and c) activated at the logic low level in synchronization with the write word line signal.

Also, in a read operation, a read word line signal activated at a logic high level is applied to the read word line, and the synchronization pulse signal is: a) maintained at a first level between the logic high level and a logic low level before the read word line signal is activated at the logic high level, and b) activated at the logic high level in synchronization with the read word line signal.

In accordance with another embodiment, a memory device includes a memory cell array including a plurality of memory cells coupled to a plurality of write word lines, a plurality of write bit lines, a plurality of read word lines, a plurality of read bit lines, and a plurality of synchronization control lines, each of the plurality of memory cells including: a write transistor including a gate electrode coupled to a corresponding write word line, a first electrode coupled to a corresponding write bit line, and a second electrode coupled to a storage node; a read transistor including a gate electrode coupled to the storage node, a first electrode coupled to a corresponding read word line, and a second electrode coupled to a corresponding read bit line; and a metal oxide semiconductor (MOS) capacitor including a gate electrode coupled to the storage node and a lower electrode coupled to a corresponding synchronization control line, the lower electrode coupled to receive a synchronization pulse signal through the corresponding synchronization control line; and a controller configured to control an operation of the memory cell array through the plurality of write word lines, the plurality of write bit lines, the plurality of read word lines, the plurality of read bit lines, and the plurality of synchronization control lines. Each of the plurality of memory cells may share the MOS capacitor with at least one adjacent memory cell.

In accordance with another embodiment, a memory cell includes a storage node; and a metal oxide semiconductor (MOS) capacitor including a gate coupled to the storage node and an electrode coupled to a synchronization control line, the MOS capacitor adding a coupling voltage to the gate based on a change in voltage on the synchronization control line, the coupling voltage to maintain the storage node within a predetermined range. The predetermined range may correspond to a logical data value. The storage node may be coupled between a write transistor and a read transistor. The MOS capacitor may be shared by at least one additional memory cell. Also, the change in voltage on the synchronization control line may occur before a read time or a write time.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
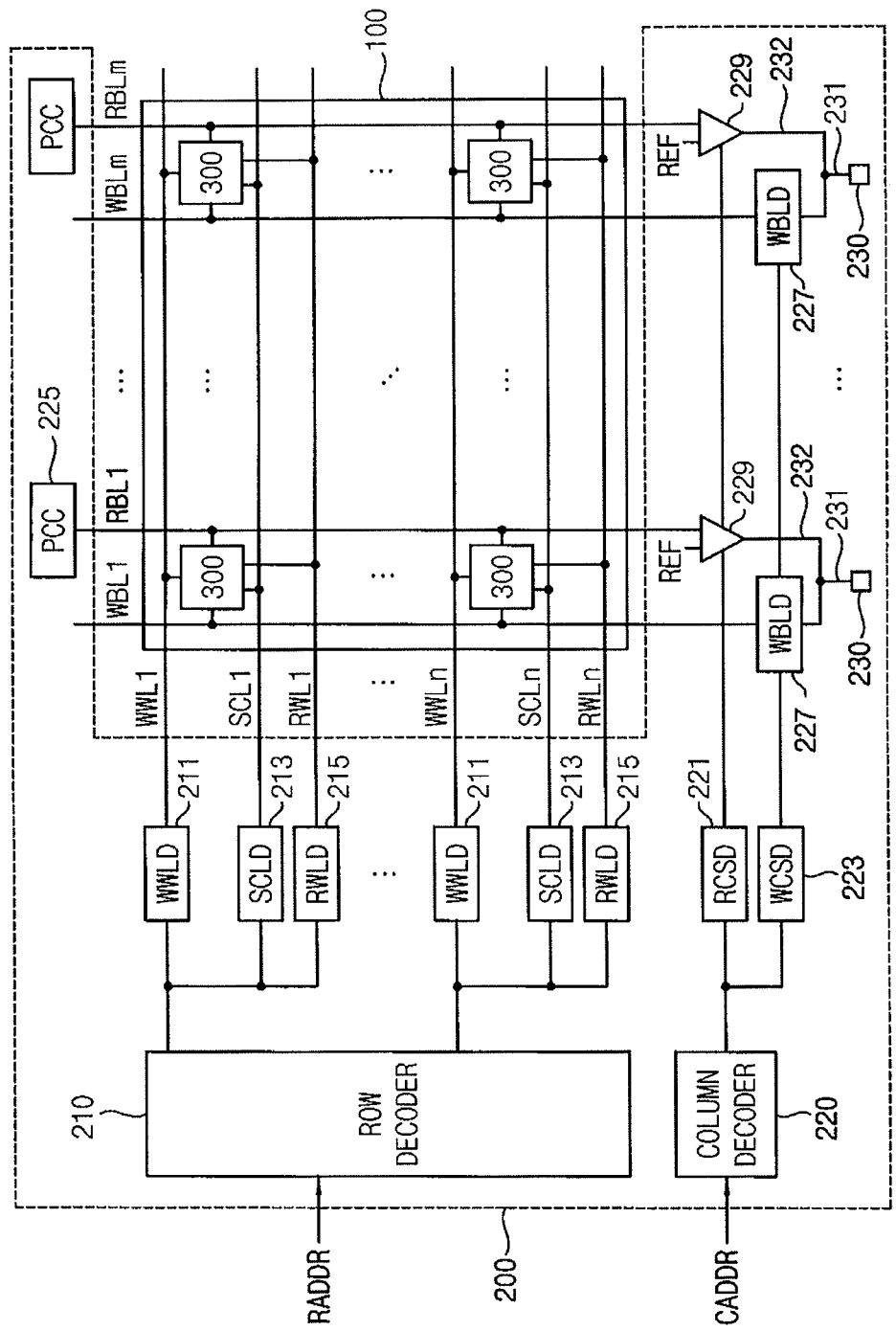
FIG. 1 illustrates an embodiment of a memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

FIG. 1 illustrates an embodiment of a memory device 10 which includes a memory cell array 100 and a control unit 200. The memory cell array 100 includes a plurality of memory cells 300 arranged in a matrix form. The plurality of memory cells 300 are coupled to a plurality of write word lines WWL1, . . . , WWLn, a plurality of write bit lines WBL1, . . . , WBLm, a plurality of read word lines RWL1, . . . , RWLn, a plurality of read bit lines RBL1, . . . , RBLm and a plurality of synchronization control lines SCL1, . . . , SCLn. Here, n and m represent positive integers.

The plurality of write word lines WWL1, . . . , WWLn, the plurality of read word lines RWL1, . . . , RWLn and the plurality of synchronization control lines SCL1, . . . , SCLn may be formed in a row direction such that each of the plurality of write word lines WWL1, . . . , WWLn, the plurality of read word lines RWL1, . . . , RWLn and the plurality of synchronization control lines SCL1, . . . , SCLn may be commonly coupled to memory cells 300 in a same row. The plurality of write bit lines WBL1, . . . , WBLm and the plurality of read bit lines RBL1, . . . , RBLm, may be formed in a column direction such that each of the plurality of write bit lines WBL1, . . . , WBLm and the plurality of read bit lines RBL1, . . . , RBLm may be commonly coupled to memory cells 300 in a same column.

The control unit 200 controls an operation of the memory cell array 100 through the plurality of write word lines WWL1, . . . , WWLn, the plurality of write bit lines WBL1, . . . , WBLm, the plurality of read word lines RWL1, . . . , RWLn, the plurality of read bit lines RBL1, . . . , RBLm, and the plurality of synchronization control lines SCL1, . . . , SCLn.

For example, the control unit 200 may perform a write operation by applying a write word line signal to the plurality of write word lines WWL1, . . . , WWLn, applying a synchronization pulse signal to the plurality of synchronization control lines SCL1, . . . , SCLn, and then providing write data to the plurality of write bit lines WBL1, . . . , WBLm. The control unit 200 may perform a read operation by applying a read word line signal to the plurality of read word lines RWL1, . . . , RWLn, applying the synchronization pulse signal to the plurality of synchronization control lines SCL1, . . . , SCLn, and then receiving read data from the memory cell array 100 through the plurality of read bit lines RBL1, . . . , RBLm.

Figure 2:
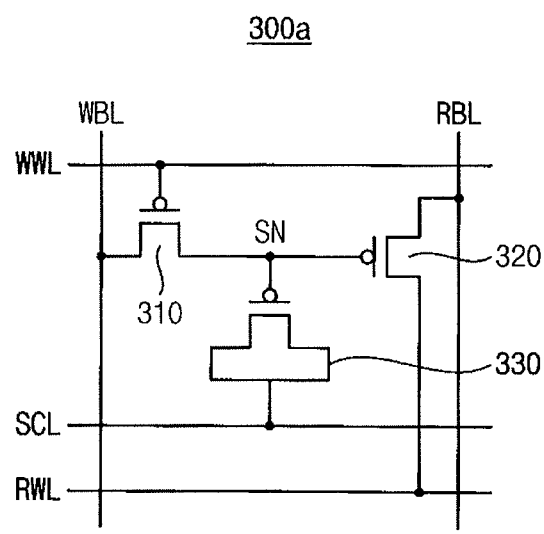
FIG. 2 illustrates an example of a memory cell in the memory device of FIG. 1.

FIG. 2 illustrates an example of a memory cell 300a in the memory device of FIG. 1. Referring to FIG. 2, the memory cell 300a may include a write transistor 310, a read transistor 320, and a metal oxide semiconductor (MOS) capacitor 330.

As illustrated in FIG. 2, the write transistor 310 and the read transistor 320 may be p-type MOS transistors. The write transistor 310 may include a gate electrode coupled to the write word line WWL, a first electrode coupled to the write bit line WBL, and a second electrode coupled to a storage node SN. The read transistor 320 may include a gate electrode coupled to the storage node SN, a first electrode coupled to the read word line RWL, and a second electrode coupled to the read bit line RBL. The MOS capacitor 330 may include a gate electrode coupled to the storage node SN and a lower electrode coupled to the synchronization control line SCL. A synchronization pulse signal from the control unit 200 may be applied to the lower electrode of the MOS capacitor 330 through the synchronization control line SCL.

Figure 3:
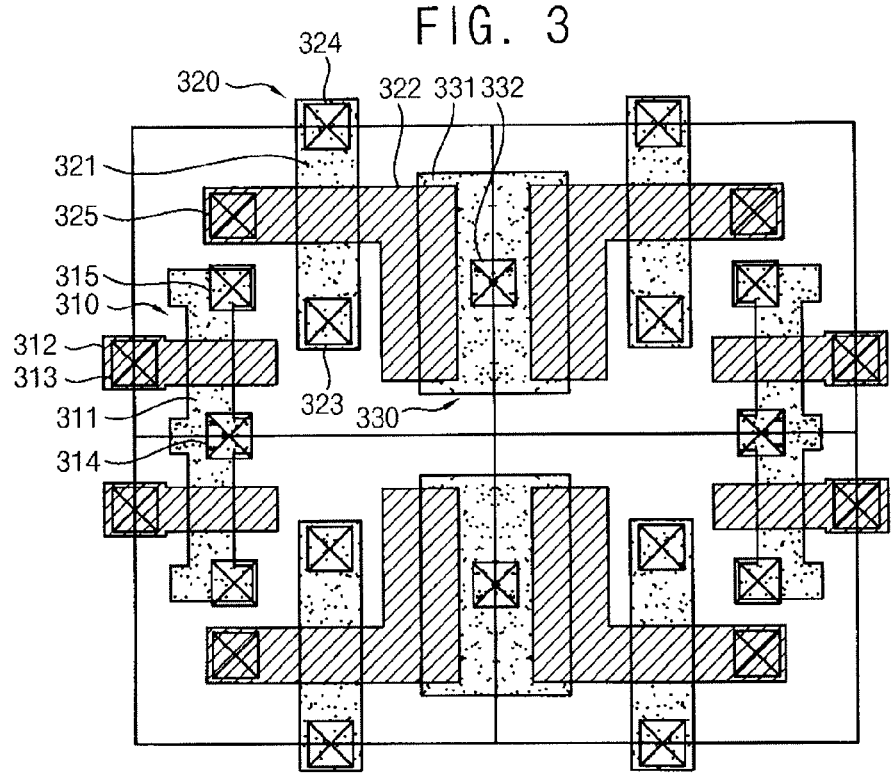
FIG. 3 illustrates an example of a layout of the memory cell of FIG. 2.

FIG. 3 illustrates an example of a layout of the memory cell of FIG. 2. In FIG. 3, the layout includes four adjacent memory cells 300a that are symmetrically arranged.

Referring to FIG. 3, a first active region 311 may be formed for the write transistor 310 and a first gate electrode layer 312 may be formed above the first active region 311 to cross the first active region 311.

The first gate electrode layer 312 may be coupled to the write word line WWL through a first contact 313, such that the first gate electrode layer 312 may operate as the gate electrode of the write transistor 310. The first gate electrode layer 312 may extend in the row direction, such that the first gate electrode layer 312 may be shared with an adjacent memory cell 300a in the row direction. The first contact 313 may be formed on a first edge of the memory cell 300a, such that the first contact 313 may be shared with an adjacent memory cell 300a in the row direction. The write word line WWL may be formed in the row direction, such that the write word line WWL may be commonly connected to the first contacts 313 of the memory cells 300a arranged in a same row.

Impurities may be implanted at a first portion and a second portion of the first active region 311. The first portion of the first active region 311 may be located on a first side of the first gate electrode layer 312. The second portion of the first active region 311 may be located on a second side of the first gate electrode layer 312.

The first portion of the first active region 311 may be coupled to the write bit line WBL through a second contact 314, such that the first portion of the first active region 311 may operate as the first electrode (e.g., a drain electrode or a source electrode) of the write transistor 310. The first active region 311 may extend in the column direction, such that the first active region 311 may be shared with an adjacent memory cell 300a in the column direction. The second contact 314 may be formed on a second edge of the memory cell 300a, such that the second contact 314 may be shared with and adjacent memory cell 300a in the column direction. The write bit line WBL may be formed in the column direction, such that the write bit line WBL may be commonly connected to the second contacts 314 of the memory cells 300a arranged in a same column.

The second portion of the first active region 311 may operate as the second electrode (e.g., a source electrode or a drain electrode) of the write transistor 310.

A channel region of the write transistor 310 may be formed at a third portion of the first active region 311 located below the first gate electrode layer 312. An inversion layer may be formed at the channel region when a voltage higher than a threshold voltage is applied between the source and the gate of the write transistor 310.

In addition, a second active region 321 may be formed for the read transistor 320, a third active region 331 may be formed for the MOS transistor 330, and a second gate electrode layer 322 may be formed above both the second active region 321 and the third active region 331. The second gate electrode layer 322 may be one common electrode for the gate electrode of the read transistor 320 and the gate electrode of the MOS capacitor 330. The second gate electrode layer 322 may operate as the storage node SN that stores charges corresponding to data written in the memory cell 300a.

The second gate electrode layer 322 may be formed to cross the second active region 321. Impurities may be implanted at a first portion of the second active region 321 located on a first side of the second gate electrode layer 322 and at a second portion of the second active region 321 located on a second side of the second gate electrode layer 322.

The first portion of the second active region 321 may be coupled to the read word line RWL through a third contact 323, such that the first portion of the second active region 321 may operate as the first electrode (e.g., a drain electrode or a source electrode) of the read transistor 320. The read word line RWL may be formed in the row direction, such that the read word line RWL may be commonly connected to the third contacts 323 of the memory cells 300a arranged in a same row.

The second portion of the second active region 321 may be coupled to the read bit line RBL through a fourth contact 324, such that the second portion of the second active region 321 may operate as the second electrode (e.g., a source electrode or a drain electrode) of the read transistor 320. The second active region 321 may extend in the column direction, such that the second active region 321 may be shared with an adjacent memory cell 300a in the column direction. The fourth contact 324 may be formed on a third edge of the memory cell 300a, such that the fourth contact 324 may be shared with an adjacent memory cell 300a in the column direction. The read bit line RBL may be formed in the column direction, such that the read bit line RBL may be commonly connected to the fourth contacts 324 of the memory cells 300a arranged in a same column.

A channel region of the read transistor 320 may be formed at a third portion of the second active region 321 located below the second gate electrode layer 322. An inversion layer may be formed at the channel region when a voltage higher than a threshold voltage is applied between the source and the gate of the read transistor 320.

Impurities may be implanted in the third active region 331, such that only one impurity region may be formed in the third active region 331. The third active region 331 may be coupled to the synchronization control line SCL through a fifth contact 332, such that the third active region 331 may operate as the lower electrode of the MOS capacitor 330. That is, the MOS capacitor 330 may be formed to include one lower electrode facing the gate electrode instead of including both a source electrode and a drain electrode.

As described above, since the synchronization pulse signal is applied to the lower electrode of the MOS capacitor 330 through the synchronization control line SCL, a coupling effect may occur at the storage node SN through the MOS capacitor 330 in response to the synchronization pulse signal.

As illustrated in FIG. 3, the third active region 331 may be formed in the column direction along a fourth edge of the memory cell 300a. The second gate electrode layer 322 may be formed to include a long region that overlaps the third active region 331 along the column direction. A capacitance at the storage node SN may increase since the second gate electrode layer 322 includes the long overlap region that overlaps the third active region 331. Therefore, a coupling effect at the storage node SN may increase through the MOS capacitor 330 in response to the synchronization pulse signal.

The third active region 331 may extend in the row direction, such that the third active region 331 may be shared with an adjacent memory cell 300a in the row direction. A fifth contact 332 may be formed on the fourth edge of the memory cell 300a, such that the fifth contact 332 may be shared with an adjacent memory cell 300a in the row direction. Therefore, two memory cells 300a adjacent to each other in the row direction may share one MOS capacitor 330. The synchronization control line SCL may be formed in the row direction, such that the synchronization control line SCL may be commonly connected to the fifth contacts 332 of the memory cells 300a arranged in a same row.

A sixth contact 315 may be formed to be connected to the second portion of the first active region 311 (that is, the second electrode of the write transistor 310). A seventh contact 325 may be formed to be connected to the second gate electrode layer 322. The sixth contact 315 and the seventh contact 325 may be electrically connected to each other through a wire. As such, the second electrode of the write transistor 310 may be coupled to the storage node SN.

Figure 4:
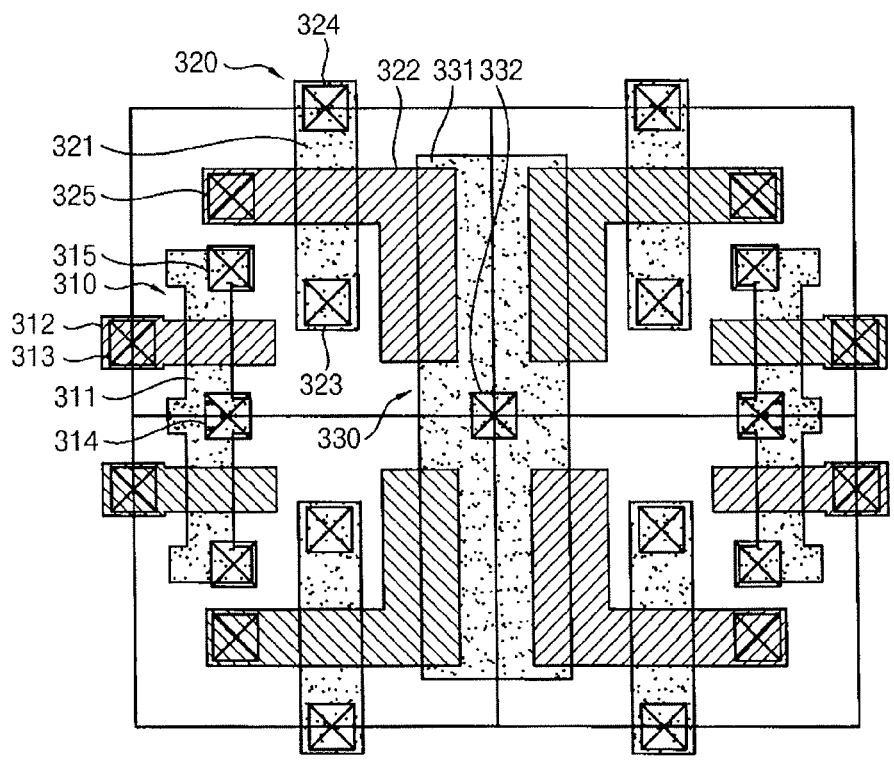
FIG. 4 illustrates another example of a layout of the memory cell of FIG. 2.

FIG. 4 illustrates another example of a layout of the memory cell of FIG. 2. This layout includes four adjacent memory cells 300a which are symmetrically arranged in the memory cell array 100. The layout of the memory cell 300a of FIG. 4 may be the same as the layout of the memory cell 300a of FIG. 3, except for locations of the third active region 331 and the fifth contact 332.

As illustrated in FIG. 4, the third active region 331 may be formed in the column direction along the fourth edge of the memory cell 300a, and may extend both in the row direction and in the column direction. Thus, the third active region 331 may be shared with adjacent memory cells 300a in the row direction and in the column direction. In addition, the fifth contact 332 may be formed on a vertex of the memory cell 300a, such that the fifth contact 332 may be shared with four memory cells 300a sharing the vertex of the memory cell 300a. Therefore, four memory cells 300a adjacent to each other in the row direction and in the column direction may share one MOS capacitor 330.

The synchronization control line SCL may be formed in the row direction, such that the synchronization control line SCL may be commonly connected to the fifth contacts 332 formed in a same row. Therefore, one synchronization control line SCL may be formed per every two rows of the memory cell array 100. As such, the number of synchronization control lines SCL in the memory cell array 100 may be reduced to half of a number of the rows in the memory cell array 100. Furthermore, according to the layout of the memory cell 300a of FIG. 4, since four memory cells 300a share one MOS capacitor 330, a size of the memory cell 300a may be reduced.

Figure 5:
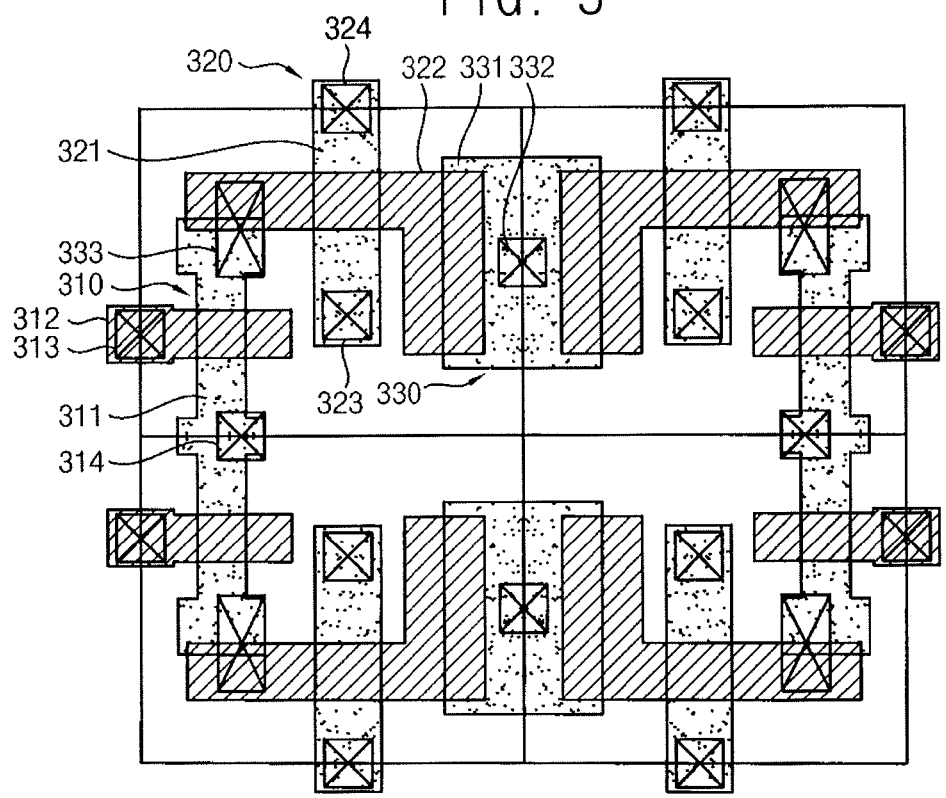
FIG. 5 illustrates another example of a layout of the memory cell of FIG. 2.

FIG. 5 illustrates another example of a layout of the memory cell of FIG. 2. This layout includes four adjacent memory cells 300a that are symmetrically arranged in the memory cell array 100. The layout of the memory cell 300a of FIG. 5 may be the same as the layout of the memory cell 300a of FIG. 3, except for a connection between the second portion of the first active region 311 (that is, the second electrode of the write transistor 310) and the second gate electrode layer 322.

As illustrated in FIG. 5, the second portion of the first active region 311 (that is, the second electrode of the write transistor 310) and the second gate electrode layer 322 may be electrically connected to each other through a shared contact 333. The second electrode of the write transistor 310 may be coupled to the storage node SN through the shared contact 333.

That is, according to the layout of the memory cell 300a of FIG. 5, since the second electrode of the write transistor 310 is coupled to the second gate electrode layer 322 through one shared contact 333 (instead of two contacts formed on each of the second electrode of the write transistor 310 and the second gate electrode layer 322), a size of the memory cell 300a may be reduced.

Figure 6:
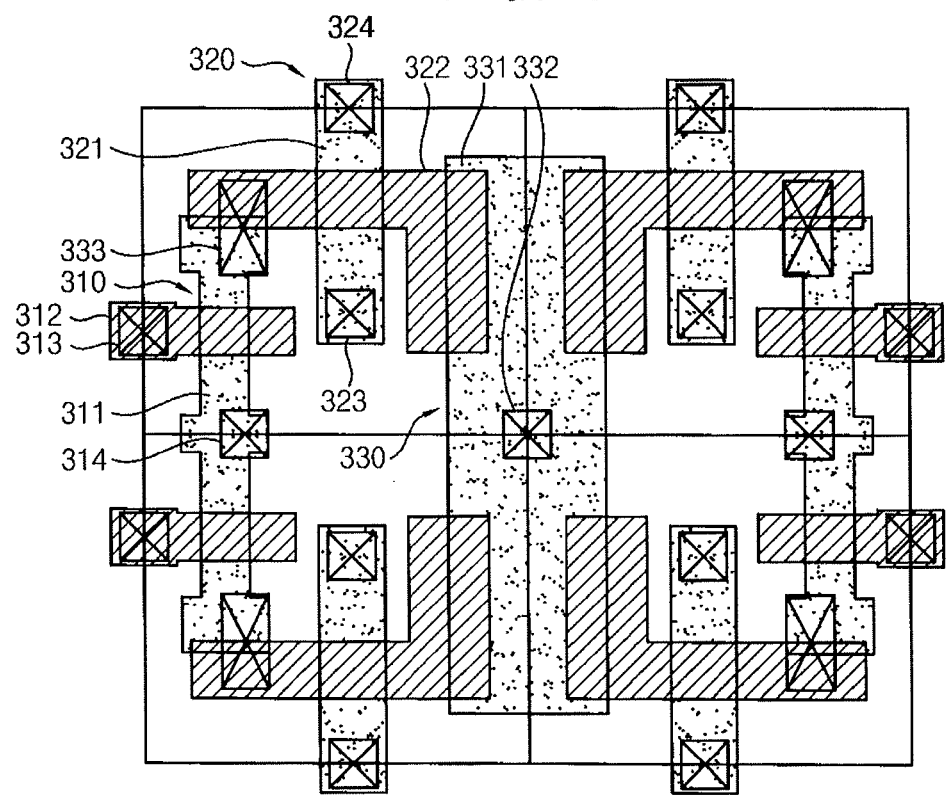
FIG. 6 illustrates another example of a layout of the memory cell of FIG. 2.

FIG. 6 illustrates another example of a layout of the memory cell of FIG. 2. This layout includes four adjacent memory cells 300a symmetrically arranged in the memory cell array 100. The layout of the memory cell 300a of FIG. 6 may be the same as the layout of the memory cell 300a of FIG. 3, except for locations of the third active region 331 and the fifth contact 332 and a connection between the second portion of the first active region 311 (that is, the second electrode of the write transistor 310) and the second gate electrode layer 322.

The locations of the third active region 331 and the fifth contact 332 in the layout of the memory cell 300a of FIG. 6 may be the same as the layout of the memory cell 300a of FIG. 4, and the connection between the second portion of the first active region 311 (that is, the second electrode of the write transistor 310) and the second gate electrode layer 322 in the layout of the memory cell 300a of FIG. 6 may be the same as the layout of the memory cell 300a of FIG. 5.

Therefore, according to the layout of the memory cell 300a of FIG. 6, since four adjacent memory cells 300a share one MOS capacitor 330 and the second electrode of the write transistor 310 is coupled to the second gate electrode layer 322 through one shared contact 333 (instead of two contacts formed on each of the second electrode of the write transistor 310 and the second gate electrode layer 322), a size of the memory cell 300a may be further reduced.

Figure 7:
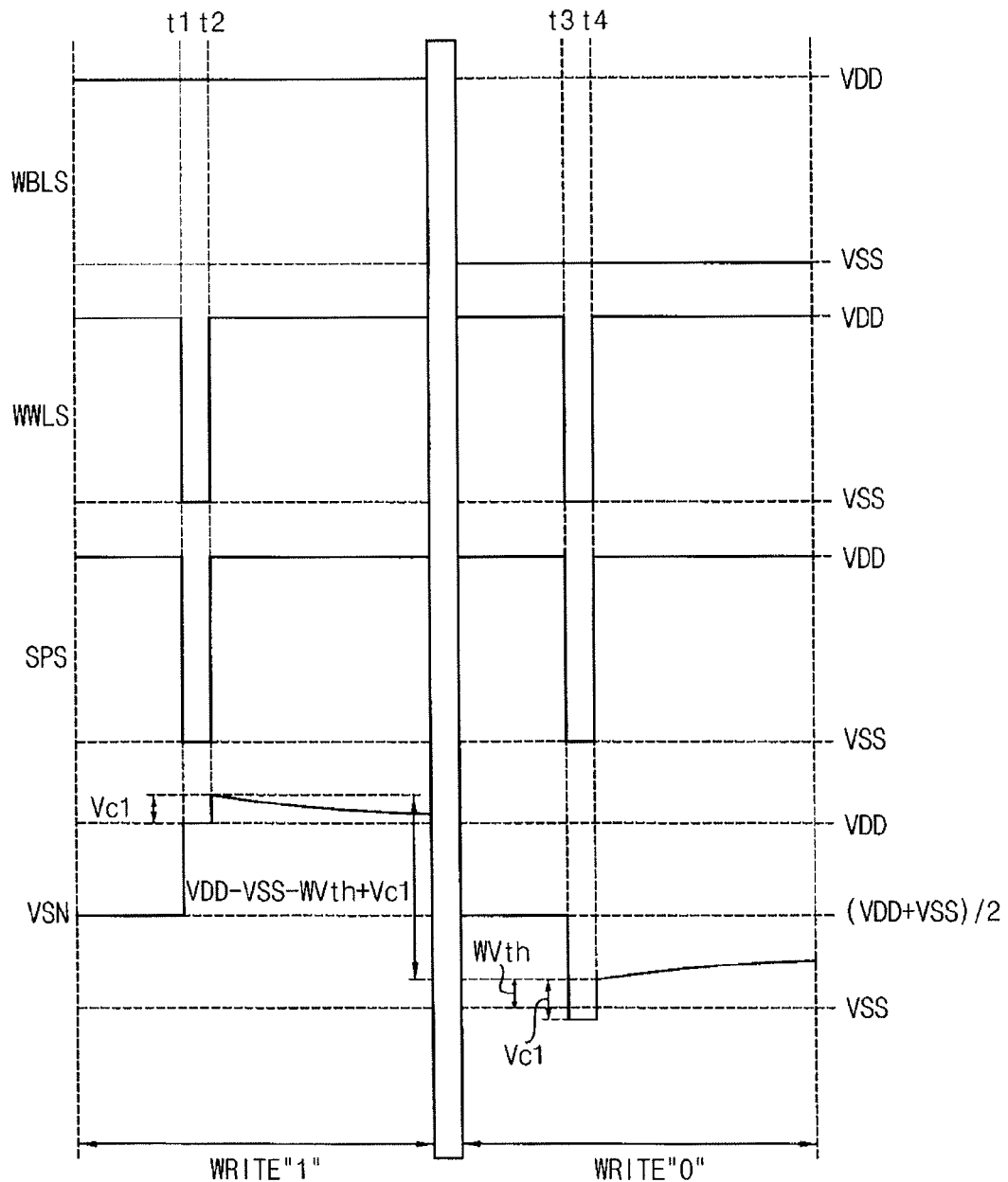
FIG. 7 illustrates a timing diagram for a write operation of the memory cell of FIG. 2.

FIG. 7 illustrates a timing diagram for describing a write operation of the memory cell of FIG. 2. The write operation of the memory cell 300a of FIG. 2 will be described with reference to FIGS. 2 and 7. Also, in FIG. 7, a supply voltage VDD represents a logic high level and a ground voltage VSS represents a logic low level. The write operation for writing data "1" is performed at a first time t1, and the write operation for writing data "0" is performed at a third time t3.

Referring to FIG. 7, in a wait mode before the first time t1 and before the third time t3, the write word line signal WWLS, which is applied to the write word line WWL, may be kept at the logic high level. Since the write word line signal WWLS having the logic high level is applied to the gate electrode of the write transistor 310, the write transistor 310 is in an off state, such that the storage node SN may be disconnected from the write bit line WBL. Therefore, data stored in the storage node SN, that is, charge stored in the storage node SN, may be maintained.

However, if a leakage current flows between the storage node SN and a body of the write transistor 310, and/or between the storage node SN and a body of the read transistor 320, the charge stored in the storage node SN may not be maintained. The leakage current may increase as a difference between a voltage VSN of the storage node SN and a voltage of the body of the write transistor 310, and/or a difference between the voltage VSN of the storage node SN and a voltage of the body of the read transistor 320, increases. As the leakage current increases, a data retention time of the memory cell 300a may decrease.

Because the write transistor 310 and the read transistor 320 are implemented as p-type MOS transistors, the body of the write transistor 310 and the body of the read transistor 320 may be set to the supply voltage VDD. Therefore, the voltage VSN of the storage node SN may be required to be kept as high as possible for decreasing the leakage current.

The voltage VSN of the storage node SN may be increased using a coupling effect caused by the MOS capacitor 330, the synchronization pulse signal SPS, which is applied to the lower electrode of the MOS capacitor 330 through the synchronization control line SCL, may be kept at the logic high level in the wait mode. As such, the leakage current occurring at the storage node SN may decrease and the data retention time of the memory cell 300a may increase.

When writing data "1" in the memory cell 300a, the write bit line signal WBLS having the logic high level may be applied to the write bit line WBL. At the first time t1, the write word line signal WWLS applied to the write word line WWL, corresponding to a selected row of the memory cell array 100, may be activated at the logic low level and the synchronization pulse signal SPS may be activated at the logic low level in synchronization with the write word line signal WWLS. Therefore, a voltage higher than a threshold voltage WVth of the write transistor 310 may be applied between the source and the gate of the write transistor 310. As such, the write transistor 310 may turn on and charges may be provided from the write bit line WBL to the storage node SN through the writing transistor 310, such that the voltage VSN of the storage node SN may be set to the supply voltage VDD.

At a second time t2, the write word line signal WWLS may be deactivated at the logic high level and the synchronization pulse signal SPS may be deactivated at the logic high level in synchronization with the write word line signal WWLS. Since a coupling effect may occur at the storage node SN by the MOS capacitor 330 in response to a transition of the synchronization pulse signal SPS from the logic low level to the logic high level, the voltage VSN of the storage node SN may increase to a voltage higher than the supply voltage VDD. As illustrated in FIG. 7, the voltage VSN of the storage node SN may increase by a first coupling voltage Vc1 from the supply voltage VDD at the second time t2.

In the wait mode after the second time t2, the synchronization pulse signal SPS may be kept at the logic high level. Therefore, as described above, the leakage current may decrease. As such, as illustrated in FIG. 7, a decrease rate of the voltage VSN of the storage node SN in the wait mode caused by the leakage current may be relatively low.

Alternatively, when writing data "0" in the memory cell 300a, the write bit line signal WBLS having the logic low level may be applied to the write bit line WBL. At the third time t3, the write word line signal WWLS applied to the write word line WWL corresponding to a selected row of the memory cell array 100 may be activated at the logic low level and the synchronization pulse signal SPS may be activated at the logic low level in synchronization with the write word line signal WWLS. Since a coupling effect may occur at the storage node SN by the MOS capacitor 330 in response to a transition of the synchronization pulse signal SPS from the logic high level to the logic low level, the voltage VSN of the storage node SN may decrease.

If the synchronization pulse signal SPS activated at the logic low level is not applied to the lower electrode of the MOS transistor 330 at the third time t3, the voltage VSN of the storage node SN may decrease to a voltage greater than the ground voltage VSS by a threshold voltage WVth of the write transistor 310. Therefore, a difference between the voltage VSN of the storage node SN in the case that data "1" is written in the memory cell 300a and the voltage VSN of the storage node SN in the case that data "0" is written in the memory cell 300a may be smaller than a difference between the supply voltage VDD and the ground voltage VSS by the threshold voltage WVth of the write transistor 310. Therefore, a data sensing margin and a data retention time of the memory cell 300a may decrease.

However, in the memory cell 300a according to example embodiments, as illustrated in FIG. 7, the synchronization pulse signal SPS is activated at the logic low level in synchronization with the write word line signal WWLS in the write operation. Therefore, the voltage VSN of the storage node SN at the third time t3 may decrease by the first coupling voltage Vc1 from a voltage that is higher than the ground voltage VSS by the threshold voltage WVth of the write transistor 310.

At a fourth time t4, the write word line signal WWLS may be deactivated at the logic high level and the synchronization pulse signal SPS may be deactivated at the logic high level in synchronization with the write word line signal WWLS. Since a coupling effect may occur at the storage node SN by the MOS capacitor 330 in response to a transition of the synchronization pulse signal SPS from the logic low level to the logic high level, the voltage VSN of the storage node SN may increase by the first coupling voltage Vc1. This, in turn, may cause the voltage VSN of the storage node SN to correspond to a voltage that is greater than the ground voltage VSS by the threshold voltage WVth of the write transistor 310.

In the wait mode after the second time t4, the synchronization pulse signal SPS may be kept at the logic high level. Therefore, as described above, the leakage current may decrease. As such, as illustrated in FIG. 7, a decrease rate of the voltage VSN of the storage node SN in the wait mode caused by the leakage current may be relatively low.

As a result, as illustrated in FIG. 7, the voltage VSN of the storage node SN in the case that data "1" is written in the memory cell 300a may be a sum of the supply voltage VDD and the first coupling voltage Vc1. The voltage VSN of the storage node SN in the case that data "0" is written in the memory cell 300a may be a sum of the ground voltage VSS and the threshold voltage WVth of the write transistor 310.

Therefore, a difference between the voltage VSN of the storage node SN in the case that data "1" is written in the memory cell 300a and the voltage VSN of the storage node SN in the case that data "0" is written in the memory cell 300a may increase by the first coupling voltage Vc1, compared to a memory cell that does not include the MOS capacitor 330. Therefore, a data sensing margin and a data retention time of the memory cell 300a may increase.

Figure 8:
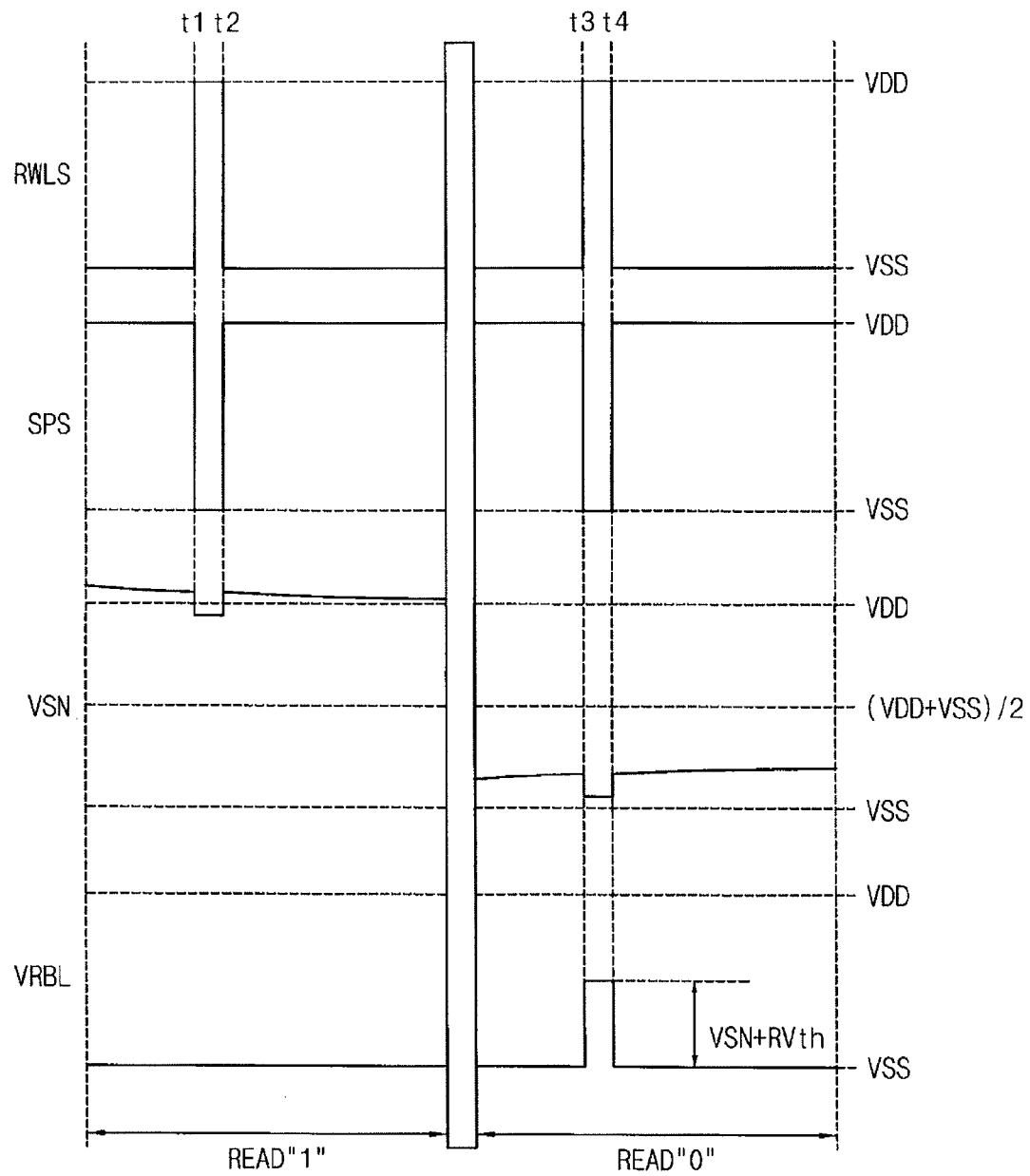
FIG. 8 illustrates a timing diagram for a read operation of the memory cell of FIG. 2.

FIG. 8 illustrates a timing diagram for describing a read operation of the memory cell of FIG. 2. The read operation of memory cell 300a of FIG. 2 will be described with reference to FIGS. 2 and 8. In FIG. 8, a supply voltage VDD represents a logic high level and a ground voltage VSS represents a logic low level. Also, the read operation for reading data "1" is performed at a first time t1, and the read operation for reading data "0" is performed at a third time t3.

Referring to FIG. 8, in a wait mode before the first time t1 and before the third time t3, the synchronization pulse signal SPS may be kept at the logic high level such that the leakage current may decrease as described above. Also, the read bit line RBL may be precharged to the logic low level in the read operation.

Referring to FIG. 2, if a memory cell 300a included in a non-selected row stores data "0" and the read word line signal RWLS having the logic high level is applied to the read word line RWL corresponding to the non-selected row, the read transistor 320 may turn on. As a result, charges may be provided from the read word line RWL to the read bit line RBL through the read transistor 320, and a voltage VRBL of the read bit line RBL may increase from the precharged level. Therefore, it is possible for an error to occur, in that the voltage VRBL of the read bit line RBL may change in a memory cell 300a included in a non-selected row.

However, if the read word line signal RWLS having the logic low level is applied to the read word line RWL corresponding to the non-selected row, a voltage higher than a threshold voltage RVth of the read transistor 320 may not be applied between the source and the gate of the read transistor 320, regardless of a logic level of data stored in the memory cell 300a included in the non-selected row. Therefore, the read transistor 320 of a memory cell 300a in a non-selected row may be maintained in an off state. Therefore, the voltage VRBL of the read bit line RBL may not change in a memory cell 300a included in a non-selected row.

Therefore, in accordance with one embodiment of the read operation of the memory cell 300a, the read word line signal RWLS activated at the logic high level may be applied to the read word line RWL corresponding to a selected row and the read word line signal RWLS kept at the logic low level may be applied to the read word lines RWL corresponding to non-selected rows.

As described above with reference to FIG. 7, the voltage VSN of the storage node SN may be a sum of the supply voltage VDD and the first coupling voltage Vc1 when data "1" is stored in the storage node SN. At the first time t1, the read word line signal RWLS applied to the read word line RWL corresponding to a selected row of the memory cell array 100 may be activated at the logic high level and the synchronization pulse signal SPS may be activated at the logic low level in synchronization with the read word line signal RWLS. Since a coupling effect may occur at the storage node SN by the MOS capacitor 330 in response to a transition of the synchronization pulse signal SPS from the logic high level to the logic low level, the voltage VSN of the storage node SN may experience a small decrease.

However, since the voltage VSN of the storage node SN is kept at a high level before the first time t1, the voltage VSN of the storage node SN may not decrease below a voltage lower than the supply voltage VDD by the threshold voltage RVth of the read transistor 320. Therefore, the read transistor 320 may be maintained at in off state, such that the voltage VRBL of the read bit line RBL may be maintained at a precharged state, that is, at the logic low level.

The control unit 200 may sense the voltage VRBL of the read bit line RBL, which is maintained at the logic low level, and determine a value of data stored in the memory cell 300a as "1".

At a second time t2, the read word line signal RWLS may be deactivated at the logic low level and the synchronization pulse signal SPS may be deactivated at the logic high level in synchronization with the read word line signal RWLS. Therefore, the voltage VSN of the storage node SN may return to a voltage at a time before the first time t1. Alternatively, as described above with reference to FIG. 7, the voltage VSN of the storage node SN may be a sum of the ground voltage VSS and the threshold voltage WVth of the write transistor 310 when data "0" is stored in the storage node SN.

At the third time t3, the read word line signal RWLS applied to the read word line RWL corresponding to a selected row of the memory cell array 100 may be activated at the logic high level and the synchronization pulse signal SPS may be activated at the logic low level in synchronization with the read word line signal RWLS.

Because a coupling effect may occur at the storage node SN by the MOS capacitor 330 in response to a transition of the synchronization pulse signal SPS from the logic high level to the logic low level, the voltage VSN of the storage node SN may experience a small decrease. Therefore, the read transistor 320 may turn on, such that charges may be provided from the read word line RWL to the read bit line RBL through the read transistor 320. Also, the voltage VRBL of the read bit line RBL may increase from the pre-charged state, that is, from the logic low level.

Since the synchronization pulse signal SPS activated at the logic low level is applied to the lower electrode of the MOS capacitor 330 at the third time t3, the voltage VSN of the storage node SN may be boosted down from a voltage at a time before the third time t3. Therefore, a current flowing from the read word line RWL to the read bit line RBL through the read transistor 320 may be also boosted up, such that a sensing margin for the control unit 200 to determine a value of data stored in the memory cell 300a may increase.

Since the read word line signal RWLS having the logic low level is applied to the read word line RWL corresponding to the non-selected row, the following effect may be produced. If the memory cell 300a in a non-selected row stores data "0" and the voltage VRBL of the read bit line RBL increases to a sum of the voltage VSN of the storage node SN and the threshold voltage RVth of the read transistor 320, the read transistor 320 of the memory cell 300a storing data "0" in the non-selected row may turn on. As a result, a current may flow from the read bit line RBL to the read word line RWL. Therefore, as illustrated in FIG. 8, the voltage VRBL of the read bit line RBL may increase up to a sum of the voltage VSN of the storage node SN of the memory cell 300a in the non-selected row and the threshold voltage RVth of the read transistor 320.

The control unit 200 may sense the voltage VRBL of the read bit line RBL, which is increased from the logic low level, and determine a value of data stored in the memory cell 300a as "0".

At a fourth time t4, the read word line signal RWLS may be deactivated at the logic low level and the synchronization pulse signal SPS may be deactivated at the logic high level in synchronization with the read word line signal RWLS. Therefore, the voltage VSN of the storage node SN may return to a voltage at a time before the third time t3.

As described above with reference to FIGS. 2, 7, and 8, the memory cell 300a may include the MOS capacitor 330 coupled to the storage node SN. A synchronization pulse signal SPS may be applied to the lower electrode of the MOS capacitor 330 in synchronization with the write word line signal WWLS in the write operation. The synchronization pulse signal SPS may also be applied to the lower electrode of the MOS capacitor 330 in synchronization with the read word line signal RWLS in the read operation. As a result, a coupling effect may occur at the storage node SN through the MOS capacitor 330 in response to the synchronization pulse signal SPS. Therefore, a data retention time of the memory cell 300a may increase and a refresh period of the memory cell 300a may also increase. A refresh operation of the memory cell 300a may be performed by performing the read operation and the write operation consecutively.

Figure 9:
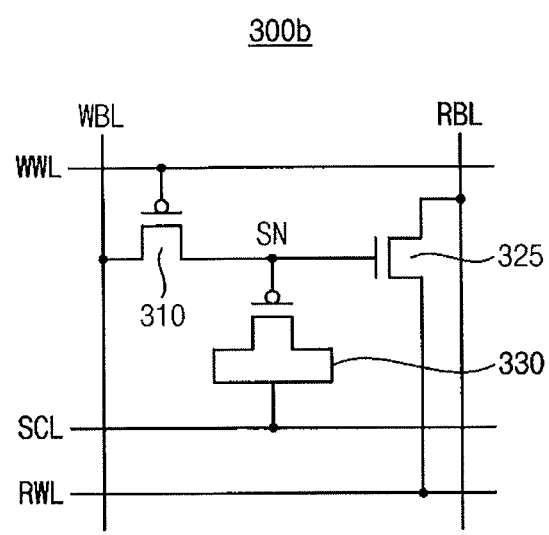
FIG. 9 illustrates another example of a memory cell in the memory device of FIG. 1.

FIG. 9 illustrates another example of a memory cell 300b, which may be included in the memory device of FIG. 1. The memory cell 300b may include a write transistor 310, a read transistor 325, and a metal oxide semiconductor (MOS) capacitor 330.

The write transistor 310 may be implemented as a p-type MOS transistor and the read transistor 325 may be implemented as an n-type MOS transistor. The write transistor 310 may include a gate electrode coupled to the write word line WWL, a first electrode coupled to the write bit line WBL, and a second electrode coupled to a storage node SN.

The read transistor 325 may include a gate electrode coupled to the storage node SN, a first electrode coupled to the read word line RWL, and a second electrode coupled to the read bit line RBL.

The MOS capacitor 330 may include a gate electrode coupled to the storage node SN and a lower electrode coupled to the synchronization control line SCL. The synchronization pulse signal provided from the control unit 200 may be applied to the lower electrode of the MOS capacitor 330 through the synchronization control line SCL.

The memory cell 300b of FIG. 9 may have the same layout as the memory cell 300a of FIG. 2, which are illustrated in FIGS. 3 to 6, except that the memory cell 300b uses an n-type MOS transistor as the read transistor 325.

Figure 10:
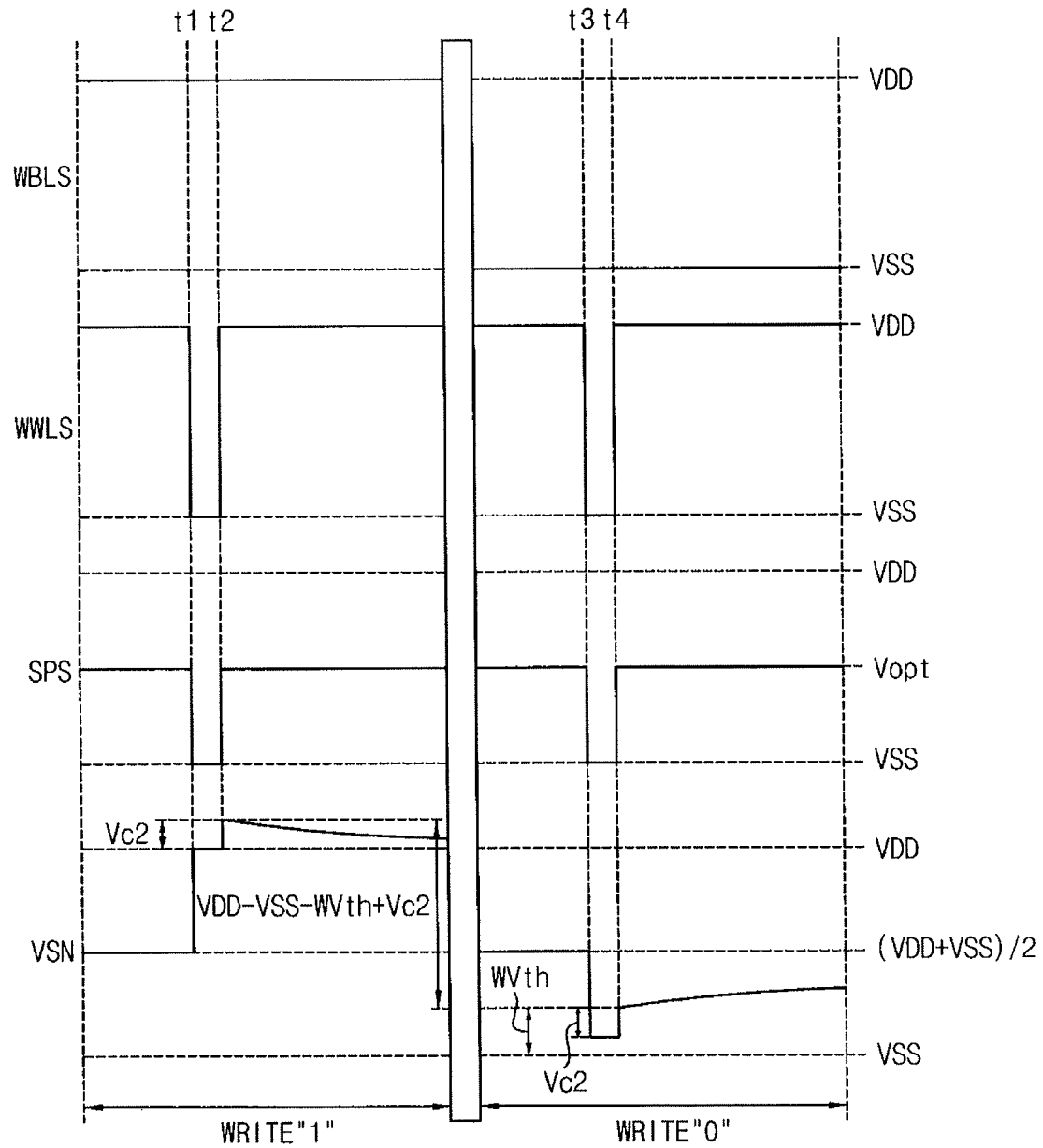
FIG. 10 illustrates a timing diagram for a write operation of the memory cell of FIG. 9.

FIG. 10 illustrates a timing diagram for describing a write operation of the memory cell of FIG. 9. The write operation of the memory cell 300b of FIG. 9 will be described with reference to FIGS. 9 and 10. In FIG. 10, a supply voltage VDD represents a logic high level and a ground voltage VSS represents a logic low level. Also, the write operation for writing data "1" is performed at a first time t1, and the write operation for writing data "0" is performed at a third time t3.

Referring to FIG. 10, in a wait mode before the first time t1 and before the third time t3, the write word line signal WWLS, which is applied to the write word line WWL, may be kept at the logic high level. Since the write word line signal WWLS having the logic high level is applied to the gate electrode of the write transistor 310, the write transistor 310 may be maintained in an off state, such that the storage node SN may be disconnected from the write bit line WBL. Therefore, data stored in the storage node SN, that is, charges stored in the storage node SN may be maintained.

However, if a leakage current flows between the storage node SN and a body of the write transistor 310 and/or between the storage node SN and a body of the read transistor 325, the charge stored in the storage node SN may not be maintained. The leakage current may increase as a difference between a voltage VSN of the storage node SN and a voltage of the body of the write transistor 310, and/or a difference between the voltage VSN of the storage node SN and a voltage of the body of the read transistor 325, increases. As the leakage current increases, a data retention time of the memory cell 300b may decrease.

As described above, because the write transistor 310 is implemented with a p-type MOS transistor, the body of the write transistor 310 may be set to the supply voltage VDD. Also, because the read transistor 325 is implemented with an n-type MOS transistor, the body of the read transistor 325 may be set to the ground voltage VSS. Therefore, the synchronization pulse signal SPS, which is applied to the lower electrode of the MOS capacitor 330 through the synchronization control line SCL, may be kept at an optimum or predetermined voltage Vopt between the supply voltage VDD and the ground voltage VSS in the wait mode. As a result, a sum of the leakage current flowing between the storage node SN and the body of the write transistor 310 may be reduced or minimized, and the leakage current flowing between the storage node SN and the body of the read transistor 325 may be reduced or minimized. As such, the data retention time of the memory cell 300b may increase.

When writing data "1" in the memory cell 300b, the write bit line signal WBLS having the logic high level may be applied to the write bit line WBL. At the first time t1, the write word line signal WWLS applied to the write word line WWL corresponding to a selected row of the memory cell array 100 may be activated at the logic low level and the synchronization pulse signal SPS may be activated at the logic low level in synchronization with the write word line signal WWLS. Therefore, a voltage higher than a threshold voltage WVth of the write transistor 310 may be applied between the source and the gate of the write transistor 310. As such, the write transistor 310 may turn on and charge may be provided from the write bit line WBL to the storage node SN through the writing transistor 310. As a result, the voltage VSN of the storage node SN may be set to the supply voltage VDD.

At a second time t2, the write word line signal WWLS may be deactivated at the logic high level and the synchronization pulse signal SPS may be deactivated at the optimum or predetermined voltage Vopt in synchronization with the write word line signal WWLS. Since a coupling effect may occur at the storage node SN by the MOS capacitor 330 in response to a transition of the synchronization pulse signal SPS from the logic low level to the optimum or predetermined voltage Vopt, the voltage VSN of the storage node SN may increase to a voltage higher than the supply voltage VDD.

While the synchronization pulse signal SPS changes from the logic low level to the logic high level at the second time t2 in the timing diagram of the memory cell 300a in FIG. 7, the synchronization pulse signal SPS changes from the logic low level to the optimum or predetermined voltage Vopt, which is lower than the logic high level, at the second time t2 in the timing diagram of the memory cell 300b in FIG. 10.

Therefore, a coupling effect occurring at the storage node SN of the memory cell 300b at the second time t2 may be less than a coupling effect occurring at the storage node SN of the memory cell 300a at the second time t2. As such, as illustrated in FIG. 10, the voltage VSN of the storage node SN may increase by a second coupling voltage Vc2, which is lower than the first coupling voltage Vc1, from the supply voltage VDD at the second time t2. In at least one embodiment, Vopt may be a predetermined voltage different from an optimum value to meet, for example, the requirements of a given application.

In the wait mode after the second time t2, the synchronization pulse signal SPS may be kept at the optimum or predetermined voltage Vopt. Therefore, as described above, the leakage current may be minimized. As such, as illustrated in FIG. 10, a decrease rate of the voltage VSN of the storage node SN in the wait mode caused by the leakage current may be relatively low.

Alternatively, when writing data "0" in the memory cell 300b, the write bit line signal WBLS having the logic low level may be applied to the write bit line WBL. At the third time t3, the write word line signal WWLS applied to the write word line WWL corresponding to a selected row of the memory cell array 100 may be activated at the logic low level. The synchronization pulse signal SPS may be activated at the logic low level in synchronization with the write word line signal WWLS. Since a coupling effect may occur at the storage node SN by the MOS capacitor 330 in response to a transition of the synchronization pulse signal SPS from the optimum or predetermined voltage Vopt to the logic low level, the voltage VSN of the storage node SN may decrease.

If the synchronization pulse signal SPS activated at the logic low level is not applied to the lower electrode of the MOS transistor 330 at the third time t3, the voltage VSN of the storage node SN may decrease to a voltage higher than the ground voltage VSS by the threshold voltage WVth of the write transistor 310. Therefore, a difference between the voltage VSN of the storage node SN in the case that data "1" is written in the memory cell 300b and the voltage VSN of the storage node SN in the case that data "0" is written in the memory cell 300b may be smaller than a difference between the supply voltage VDD and the ground voltage VSS by the threshold voltage WVth of the write transistor 310. Therefore, a data sensing margin and a data retention time of the memory cell 300b may decrease.

However, in the memory cell 300b according to example embodiments, as illustrated in FIG. 10, the synchronization pulse signal SPS is activated at the logic low level in synchronization with the write word line signal WWLS in the write operation. Therefore, the voltage VSN of the storage node SN may further decrease at the third time t3, regardless of the threshold voltage WVth of the write transistor 310. For example, since a coupling effect, which has a similar strength to a coupling effect occurring at the second time t2, may occur at the third time t3, the voltage VSN of the storage node SN at the third time t3 may decrease by the second coupling voltage Vc2 from a voltage that is higher than the ground voltage VSS by the threshold voltage WVth of the write transistor 310.

At a fourth time t4, the write word line signal WWLS may be deactivated at the logic high level and the synchronization pulse signal SPS may be deactivated at the optimum or predetermined voltage Vopt in synchronization with the write word line signal WWLS. Since a coupling effect may occur at the storage node SN by the MOS capacitor 330 in response to a transition of the synchronization pulse signal SPS from the logic low level to the optimum or predetermined voltage Vopt, the voltage VSN of the storage node SN may increase by the second coupling voltage Vc2. As a result, the voltage VSN of the storage node SN may correspond to a voltage that is higher than the ground voltage VSS by the threshold voltage WVth of the write transistor 310.

In the wait mode after the second time t4, the synchronization pulse signal SPS may be kept at the optimum or predetermined voltage Vopt. Therefore, as described above, the leakage current may be reduced or minimized. As such, as illustrated in FIG. 10, a decrease rate of the voltage VSN of the storage node SN in the wait mode caused by the leakage current may be relatively low.

As a result, as illustrated in FIG. 10, in the case that data "1" is written in the memory cell 300b, the voltage VSN of the storage node SN may be a sum of the supply voltage VDD and the second coupling voltage Vc2. In the case that data "0" is written in the memory cell 300b, the voltage VSN of the storage node SN may be a sum of the ground voltage VSS and the threshold voltage WVth of the write transistor 310. Therefore, a difference between the voltage VSN of the storage node SN in the case that data "1" is written in the memory cell 300b and the voltage VSN of the storage node SN in the case that data "0" is written in the memory cell 300b may increase by the second coupling voltage Vc2, compared to a memory cell that does not include the MOS capacitor 330. Therefore, a data sensing margin and a data retention time of the memory cell 300a may increase.

Figure 11:
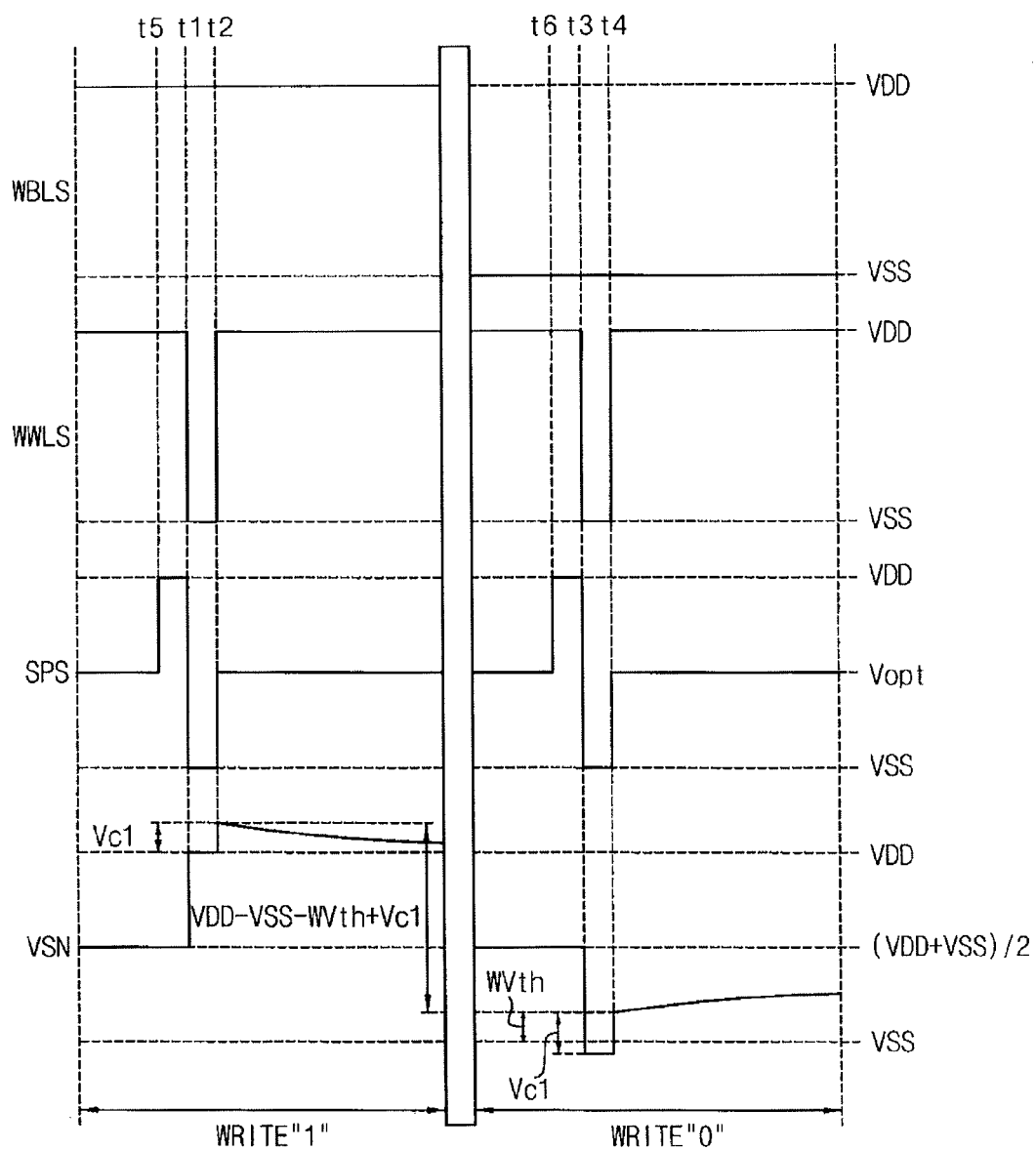
FIG. 11 illustrates another timing diagram for a write operation of the cell of FIG. 9.

FIG. 11 illustrates another timing diagram for describing a write operation of the memory cell of FIG. 9. The timing diagram of FIG. 11 may be the same as the timing diagram of FIG. 10, except for the synchronization pulse signal SPS.

Referring to FIG. 11, the synchronization pulse signal SPS may be kept at the optimum or predetermined voltage Vopt in the wait mode and may change to the logic high level at a fifth time t5, that is, just before the synchronization pulse signal SPS is activated at the logic low level at the first time t1 in synchronization with the write word line signal WWLS. Similarly, the synchronization pulse signal SPS may be kept at the optimum or predetermined voltage Vopt in the wait mode and may change to the logic high level at a sixth time t6, that is, just before the synchronization pulse signal SPS is activated at the logic low level at the third time t3 in synchronization with the write word line signal WWLS. That is, the synchronization pulse signal SPS may transit from the optimum or predetermined voltage Vopt to the logic high level just before the write operation, and then greatly change from the logic high level to the logic low level in the write operation to magnify a coupling effect occurring at the storage node SN by the MOS capacitor 330 during the write operation.

Therefore, similar to the timing diagram of FIG. 7, in the case that data "1" is written in the memory cell 300b, the voltage VSN of the storage node SN may be a sum of the supply voltage VDD and the first coupling voltage Vc1. In the case that data "0" is written in the memory cell 300b, the voltage VSN of the storage node SN may be a sum of the ground voltage VSS and the threshold voltage WVth of the write transistor 310. Therefore, a difference between the voltage VSN of the storage node SN in the case that data "1" is written in the memory cell 300b and the voltage VSN of the storage node SN in the case that data "0" is written in the memory cell 300b may increase by the first coupling voltage Vc1, compared to a memory cell that does not include the MOS capacitor 330. Therefore, a data sensing margin and a data retention time of the memory cell 300b may further increase.

Figure 12:
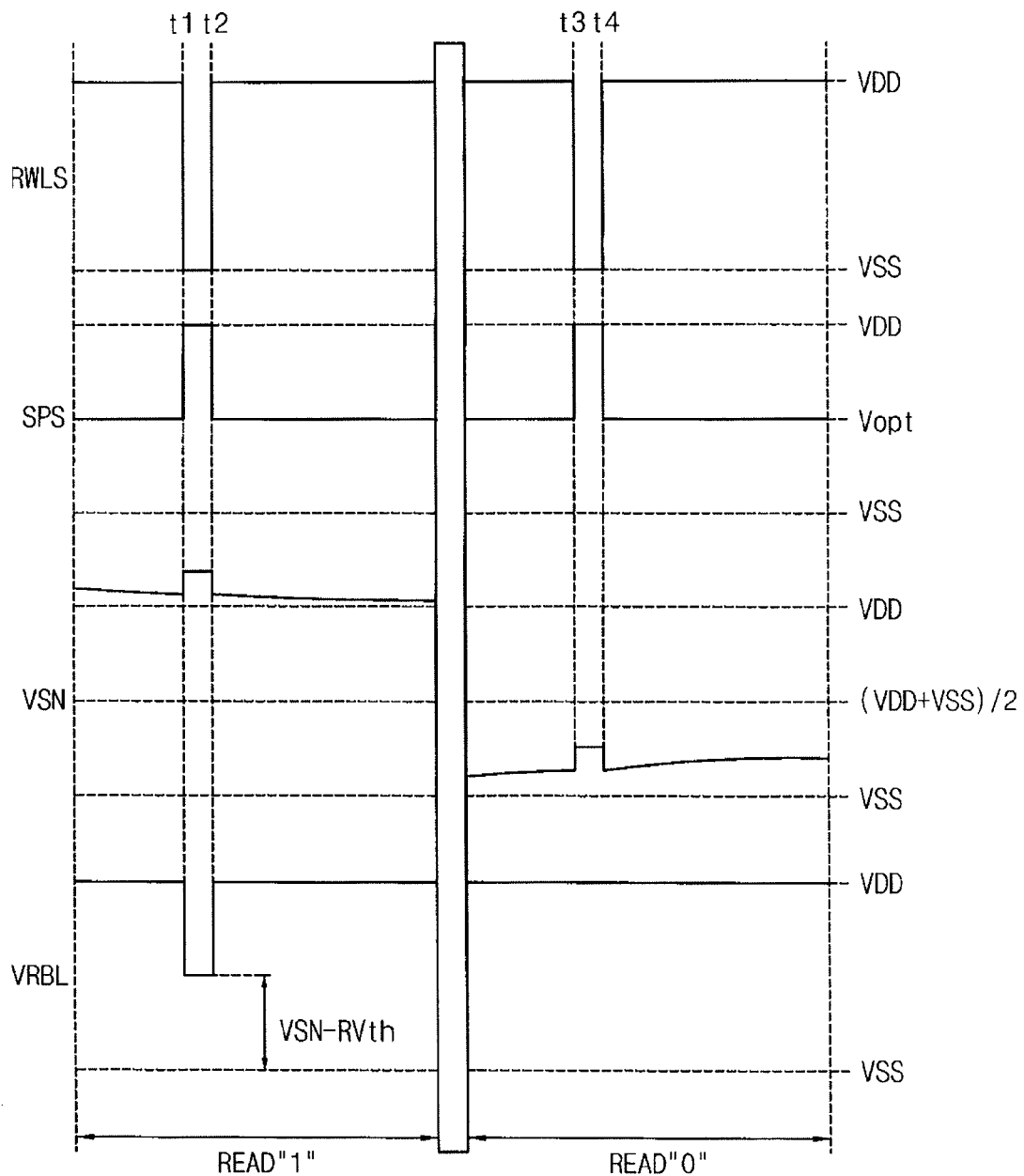
FIG. 12 illustrates a timing diagram for a read operation of the memory cell of FIG. 9.

FIG. 12 illustrates a timing diagram for describing a read operation of the memory cell of FIG. 9. The read operation of the memory cell 300b of FIG. 9 will be described with reference to FIGS. 9 and 12. In FIG. 12, a supply voltage VDD represents a logic high level and a ground voltage VSS represents a logic low level. Also, the read operation for reading data "1" is performed at a first time t1, and the read operation for reading data "0" is performed at a third time t3.

In a wait mode before the first time t1 and before the third time t3, the synchronization pulse signal SPS may be kept at the optimum or predetermined voltage Vopt such that the leakage current may be reduced or minimized as described above.

In the read operation, the read bit line RBL may be pre-charged to the logic high level.

Referring to FIG. 9, if a memory cell 300b included in a non-selected row stores data "1" and the read word line signal RWLS having the logic low level is applied to the read word line RWL corresponding to the non-selected row, the read transistor 325 may turn on. As a result, charges may be discharged from the read bit line RBL to the read word line RWL through the read transistor 325, and a voltage VRBL of the read bit line RBL may decrease from the pre-charged level. Therefore, an error may occur in which the voltage VRBL of the read bit line RBL changes in a memory cell 300b included in a non-selected row.

However, if the read word line signal RWLS having the logic high level is applied to the read word line RWL corresponding to a non-selected row, a voltage higher than a threshold voltage RVth of the read transistor 325 may not be applied between the source and the gate of the read transistor 325, regardless of a logic level of data stored in the memory cell 300b included in the non-selected row. Therefore, the read transistor 325 of the memory cell 300b in the non-selected row may be kept in an off state. Therefore, the voltage VRBL of the read bit line RBL may not change by the memory cell 300b in the non-selected row.

Therefore, in the read operation of memory cell 300b according to example embodiments, the read word line signal RWLS activated at the logic low level may be applied to the read word line RWL corresponding to a selected row, and the read word line signal RWLS kept at the logic high level may be applied to the read word lines RWL corresponding to non-selected rows.

As described above with reference to FIG. 11, the voltage VSN of the storage node SN may be a sum of the supply voltage VDD and the first coupling voltage Vc1 when data "1" is stored in the storage node SN. At the first time t1, the read word line signal RWLS applied to the read word line RWL corresponding to a selected row of the memory cell array 100 may be activated at the logic low level and the synchronization pulse signal SPS may be activated at the logic high level in synchronization with the read word line signal RWLS. Because a coupling effect may occur at the storage node SN by the MOS capacitor 330 in response to a transition of the synchronization pulse signal SPS from the optimum or predetermined voltage Vopt to the logic low level, the voltage VSN of the storage node SN may increase by a small amount. Therefore, the read transistor 325 may turn on. As a result, charge may discharge from the read bit line RBL to the read word line RWL through the read transistor 325, and the voltage VRBL of the read bit line RBL may decrease from the pre-charged state, that is, from the logic high level.

Since the synchronization pulse signal SPS activated at the logic high level is applied to the lower electrode of the MOS capacitor 330 at the first time t1, the voltage VSN of the storage node SN may be boosted up from a voltage at a time before the first time t1. Therefore, a current flowing from the read bit line RBL to the read word line RWL through the read transistor 325 may be also boosted up. As a result, a sensing margin for the control unit 200 to determine a value of data stored in the memory cell 300b may increase.

As indicated, the read word line signal RWLS having the logic high level is applied to the read word line RWL corresponding to a non-selected row. If the memory cell 300b in the non-selected row stores data "1" and the voltage VRBL of the read bit line RBL decreases by the threshold voltage RVth of the read transistor 325 from the voltage VSN of the storage node SN, the read transistor 325 of the memory cell 300b storing data "1" in the non-selected row may turn on. As a result, a current may flow from the read word line RWL to the read bit line RBL. Therefore, as illustrated in FIG. 12, the voltage VRBL of the read bit line RBL may decrease to a voltage that is lower than the voltage VSN of the storage node SN of the memory cell 300b in the non-selected row, by the threshold voltage RVth of the read transistor 325.

The control unit 200 may sense the voltage VRBL of the read bit line RBL which decreased from the logic high level, and may determine a value of data stored in the memory cell 300b as "1".

At a second time t2, the read word line signal RWLS may be deactivated at the logic high level and the synchronization pulse signal SPS may be deactivated at the optimum or predetermined voltage Vopt in synchronization with the read word line signal RWLS. Therefore, the voltage VSN of the storage node SN may return to a voltage at a time before the first time t1.

Alternatively, when reading data "0" from the memory cell 300b, the read word line signal RWLS applied to the read word line RWL may be activated at the logic low level and the synchronization pulse signal SPS may be activated at the logic high level in synchronization with the read word line signal RWLS at the third time t3. Since a coupling effect may occur at the storage node SN by the MOS capacitor 330 in response to a transition of the synchronization pulse signal SPS from the optimum or predetermined voltage Vopt to the logic high level, the voltage VSN of the storage node SN may increase by a small amount. However, since data "0" (that is, the logic low level) is stored in the storage node SN, the read transistor 325 may be kept in an off state. Therefore, the voltage VRBL of the read bit line RBL may be maintained at a pre-charged state, that is, at the logic high level.

The control unit 200 may sense the voltage VRBL of the read bit line RBL, which is maintained at the logic high level, and determine a value of data stored in the memory cell 300b as "0."

At a fourth time t4, the read word line signal RWLS may be deactivated at the logic high level and the synchronization pulse signal SPS may be deactivated at the optimum or predetermined voltage Vopt in synchronization with the read word line signal RWLS. Therefore, the voltage VSN of the storage node SN may return to a voltage at a time before the third time t3.

As described above with reference to FIGS. 9, 10, 11 and 12, the memory cell 300b may include the MOS capacitor 330 coupled to the storage node SN. The synchronization pulse signal SPS may be applied to the lower electrode of the MOS capacitor 330 in synchronization with the write word line signal WWLS in the write operation. The synchronization pulse signal SPS may also be applied to the lower electrode of the MOS capacitor 330 in synchronization with the read word line signal RWLS in the read operation. As a result, a coupling effect may occur at the storage node SN through the MOS capacitor 330 in response to the synchronization pulse signal SPS. Therefore, a data retention time of the memory cell 300b may increase and a refresh period of the memory cell 300b may also increase. In one embodiment, a refresh operation of the memory cell 300b may be performed by performing the read operation and the write operation consecutively.

Figure 13:
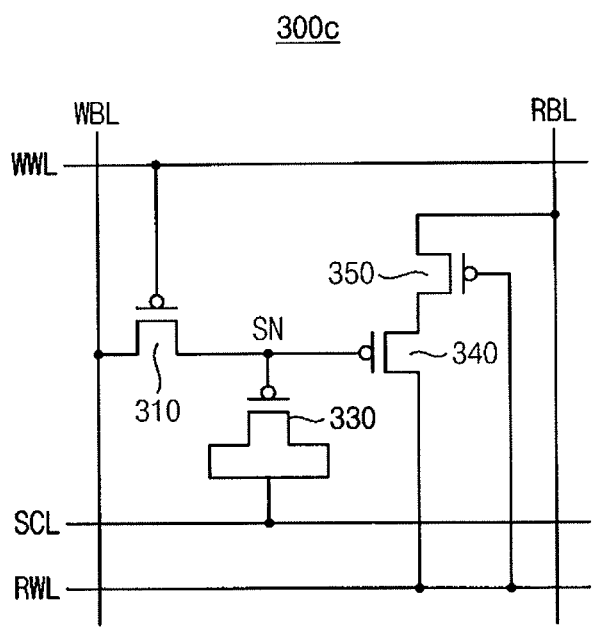
FIG. 13 illustrates another example of a memory cell in the memory device of FIG. 1.

FIG. 13 illustrates another example of a memory cell 300c which may be included in the memory device of FIG. 1. Referring to FIG. 13, the memory cell 300c may include a write transistor 310, a read transistor 340, a read switch transistor 350, and a metal oxide semiconductor (MOS) capacitor 330.

As illustrated in FIG. 13, the write transistor 310, the read transistor 340, and the read switch transistor 350 may be implemented with p-type MOS transistors.

The write transistor 310 may include a gate electrode coupled to the write word line WWL, a first electrode coupled to the write bit line WBL, and a second electrode coupled to a storage node SN.

The read transistor 340 may include a gate electrode coupled to the storage node SN, a first electrode coupled to the read word line RWL, and a second electrode coupled to a first electrode of the read switch transistor 350.

The read switch transistor 350 may include a gate electrode coupled to the read word line RWL, a first electrode coupled to the second electrode of the read transistor 340, and a second electrode coupled to the read bit line RBL.

The MOS capacitor 330 may include a gate electrode coupled to the storage node SN and a lower electrode coupled to the synchronization control line SCL. The synchronization pulse signal provided from the control unit 200 may be applied to the lower electrode of the MOS capacitor 330 through the synchronization control line SCL.

The structure of the write transistor 310 and the MOS capacitor 330 of FIG. 13, which is connected to the gate electrode of the read transistor 340, may be the same as the structure of the write transistor 310 and the MOS capacitor 330 of FIG. 2, which is connected to the gate electrode of the read transistor 320. In addition, the write transistor 310 and the read transistor 340 in the memory cell 300c of FIG. 13 may be implemented with p-type MOS transistors. The write transistor 310 and the read transistor 320 in the memory cell 300a of FIG. 2 may also be implemented with p-type MOS transistors. Therefore, the write operation of the memory cell 300c of FIG. 13 may be performed in the same way as the write operation of the memory cell 300a of FIG. 2 according to the timing diagram of FIG. 7.

Figure 14:
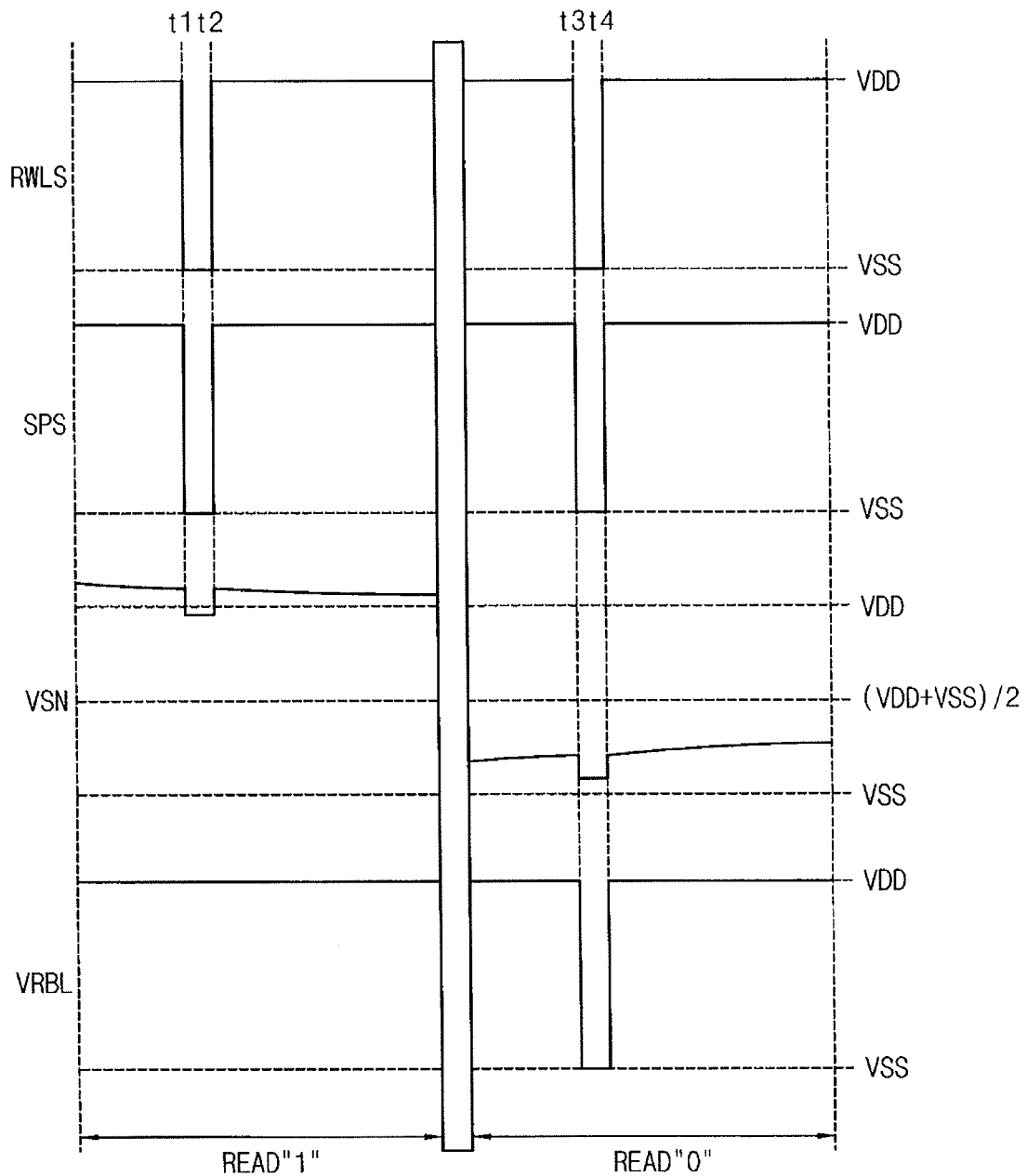
FIG. 14 illustrates a timing diagram for a read operation of the memory cell of FIG. 13.

FIG. 14 illustrates a timing diagram for describing a read operation of the memory cell 300c of FIG. 13. In FIG. 14, a supply voltage VDD represents a logic high level and a ground voltage VSS represents a logic low level. Also, the read operation for reading data "1" is performed at a first time t1, and the read operation for reading data "0" is performed at a third time t3.

As described above with reference to FIG. 7, since the write transistor 310 and the read transistor 340 are implemented with p-type MOS transistors, the body of the write transistor 310 and the body of the read transistor 340 may be set to the supply voltage VDD. Therefore, the voltage VSN of the storage node SN may be kept at a high level (e.g., as high as possible) for decreasing the leakage current. To increase the voltage VSN of the storage node SN using a coupling effect caused by the MOS capacitor 330, the synchronization pulse signal SPS, which is applied to the lower electrode of the MOS capacitor 330 through the synchronization control line SCL, may be kept at the logic high level in a wait mode before the first time t1 and before the third time t3. As such, the leakage current occurring at the storage node SN may decrease and the data retention time of the memory cell 300c may increase.

As illustrated in FIG. 14, the read bit line RBL may be pre-charged to the logic high level in the read operation. Referring to FIG. 13, if the read word line signal RWLS having the logic high level is applied to the read word line RWL corresponding to a non-selected row, the read switch transistor 350 of the memory cell 300c in the non-selected row may be kept in an off state, such that the read bit line RBL may be disconnected from the read word line RWL. Therefore, the voltage VRBL of the read bit line RBL may not change by the memory cell 300c in the non-selected row.

Therefore, in the read operation of the memory cell 300c according to example embodiments, the read word line signal RWLS activated at the logic low level may be applied to the read word line RWL corresponding to a selected row. The read word line signal RWLS kept at the logic high level may be applied to the read word lines RWL corresponding to non-selected rows.

As described above with reference to FIG. 7, the voltage VSN of the storage node SN may be a sum of the supply voltage VDD and the first coupling voltage Vc1 when data "1" is stored in the storage node SN. At the first time t1, the read word line signal RWLS applied to the read word line RWL corresponding to a selected row of the memory cell array 100 may be activated at the logic low level and the synchronization pulse signal SPS may be activated at the logic low level in synchronization with the read word line signal RWLS. Since a coupling effect may occur at the storage node SN by the MOS capacitor 330 in response to a transition of the synchronization pulse signal SPS from the logic high level to the logic low level, the voltage VSN of the storage node SN may decrease by a small amount.

Assuming that characteristics of the read transistor 340 are the same as characteristics of the read switch transistor 350, since the read switch transistor 350 is coupled between the read transistor 340 and the read bit line RBL, the voltage VSN of the storage node SN should decrease to a voltage which is lower than an average of the supply voltage VDD and the ground voltage VSS by a threshold voltage of the read transistor 340. The read transistor 340 may therefore turn on, even though the read word line signal RWLS activated at the logic low level is applied to the gate electrode of the read switch transistor 350.

However, since the voltage VSN of the storage node SN is kept at a high level to store data "1" before the first time t1, the voltage VSN of the storage node SN may not decrease below a voltage, which is lower than the average of the supply voltage VDD and the ground voltage VSS, by the threshold voltage of the read transistor 340. Therefore, the read transistor 340 may be kept in an off state, even though the read word line signal RWLS activated at the logic low level is applied to the gate electrode of the read switch transistor 350. As a result, the voltage VRBL of the read bit line RBL may be maintained at a pre-charged state, that is, at the logic high level.

The control unit 200 may sense the voltage VRBL of the read bit line RBL which is maintained at the logic high level, and may determine a value of data stored in the memory cell 300c as "1".

At a second time t2, the read word line signal RWLS may be deactivated at the logic high level and the synchronization pulse signal SPS may be deactivated at the logic high level in synchronization with the read word line signal RWLS. Therefore, the voltage VSN of the storage node SN may return to a voltage at a time before the first time t1.

Alternatively, as described above with reference to FIG. 7, the voltage VSN of the storage node SN may be a sum of the ground voltage VSS and the threshold voltage WVth of the write transistor 310 when data "0" is stored in the storage node SN. At the third time t3, the read word line signal RWLS applied to the read word line RWL corresponding to a selected row of the memory cell array 100 may be activated at the logic low level and the synchronization pulse signal SPS may be activated at the logic low level in synchronization with the read word line signal RWLS.

Since the read word line signal RWLS activated at the logic low level is applied to the gate electrode of the read switch transistor 350, the read switch transistor 350 may turn on. Since a coupling effect may occur at the storage node SN by the MOS capacitor 330 in response to a transition of the synchronization pulse signal SPS from the logic high level to the logic low level, the voltage VSN of the storage node SN may decrease by a small amount. Therefore, the read transistor 340 may also turn on, such that charge may discharge from the read bit line RBL to the read word line RWL through the read switch transistor 350 and the read transistor 340. As a result, the voltage VRBL of the read bit line RBL may decrease from the pre-charged state, that is, from the logic high level.

Since the synchronization pulse signal SPS activated at the logic low level is applied to the lower electrode of the MOS capacitor 330 at the third time t3, the voltage VSN of the storage node SN may be boosted down from a voltage at a time before the third time t3. Therefore, a current flowing from the read bit line RBL to the read word line RWL through the read switch transistor 350 and the read transistor 340 may be also boosted up. As a result, a sensing margin for the control unit 200 to determine a value of data stored in the memory cell 300c may increase.

Since the read word line signal RWLS having the logic high level is applied to the read word line RWL corresponding to a non-selected row, the read switch transistor 350 of the memory cell 300c in the non-selected row may be kept in an off state. Therefore, a current may not flow from the read word line RWL to the read bit line RBL through the read transistor 340 and the read switch transistor 350 in the memory cell 300c in the non-selected row, even though the voltage VSN of the storage node SN decreases. As such, as illustrated in FIG. 14, the voltage VSN of the storage node SN may decrease to the ground voltage VSS.

The control unit 200 may sense the voltage VRBL of the read bit line RBL which is decreased to the logic low level, and determine a value of data stored in the memory cell 300c as "0".

At a fourth time t4, the read word line signal RWLS may be deactivated at the logic high level and the synchronization pulse signal SPS may be deactivated at the logic high level in synchronization with the read word line signal RWLS. Therefore, the voltage VSN of the storage node SN may return to a voltage at a time before the third time t3.

As described above with reference to FIGS. 13 and 14, when reading data "1" from the memory cell 300c, the voltage VSN of the storage node SN may be the supply voltage VDD. When reading data "0" from the memory cell 300c, the voltage VSN of the storage node SN may be the ground voltage VSS. That is, since the memory cell 300c of FIG. 13 further includes the read switch transistor 350, the voltage VSN of the storage node SN may experience a large swing from the supply voltage VDD to the ground voltage VSS, according to a value of data stored in the memory cell 300c. Therefore, a data retention time of the memory cell 300c may further increase.

Figure 15:
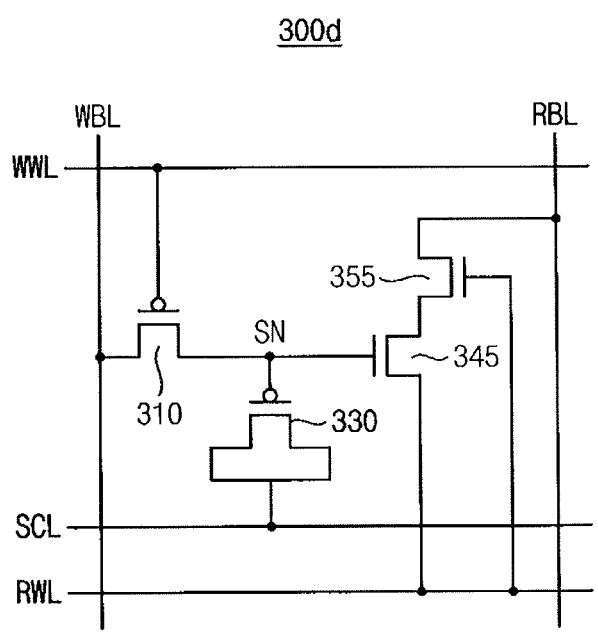
FIG. 15 illustrates another example of a memory cell in the memory device of FIG. 1.

FIG. 15 illustrates another example of a memory cell 300d which may be in the memory device of FIG. 1. The memory cell 300d may include a write transistor 310, a read transistor 345, a read switch transistor 355, and a metal oxide semiconductor (MOS) capacitor 330. The write transistor 310 may be implemented with a p-type MOS transistor, and the read transistor 345 and the read switch transistor 355 may be implemented with n-type MOS transistors.

The write transistor 310 may include a gate electrode coupled to the write word line WWL, a first electrode coupled to the write bit line WBL, and a second electrode coupled to a storage node SN.

The read transistor 345 may include a gate electrode coupled to the storage node SN, a first electrode coupled to the read word line RWL, and a second electrode coupled to a first electrode of the read switch transistor 355.

The read switch transistor 355 may include a gate electrode coupled to the read word line RWL, a first electrode coupled to the second electrode of the read transistor 345, and a second electrode coupled to the read bit line RBL.

The MOS capacitor 330 may include a gate electrode coupled to the storage node SN and a lower electrode coupled to the synchronization control line SCL. The synchronization pulse signal provided from the control unit 200 may be applied to the lower electrode of the MOS capacitor 330 through the synchronization control line SCL.

The structure of the write transistor 310 and the MOS capacitor 330 of FIG. 15, which is connected to the gate electrode of the read transistor 345, may be the same as the structure of the write transistor 310 and the MOS capacitor 330 of FIG. 9, which is connected to the gate electrode of the read transistor 325. In addition, the write transistor 310 and the read transistor 345 in the memory cell 300d of FIG. 15 may be implemented with a p-type MOS transistor and an n-type MOS transistor, respectively. The write transistor 310 and the read transistor 325 in the memory cell 300b of FIG. 9 may also be implemented with a p-type MOS transistor and an n-type MOS transistor, respectively. Therefore, the write operation of the memory cell 300d of FIG. 15 may be performed in the same way as the write operation of the memory cell 300b of FIG. 9, according to the timing diagram of FIG. 10 or 11.

Figure 16:
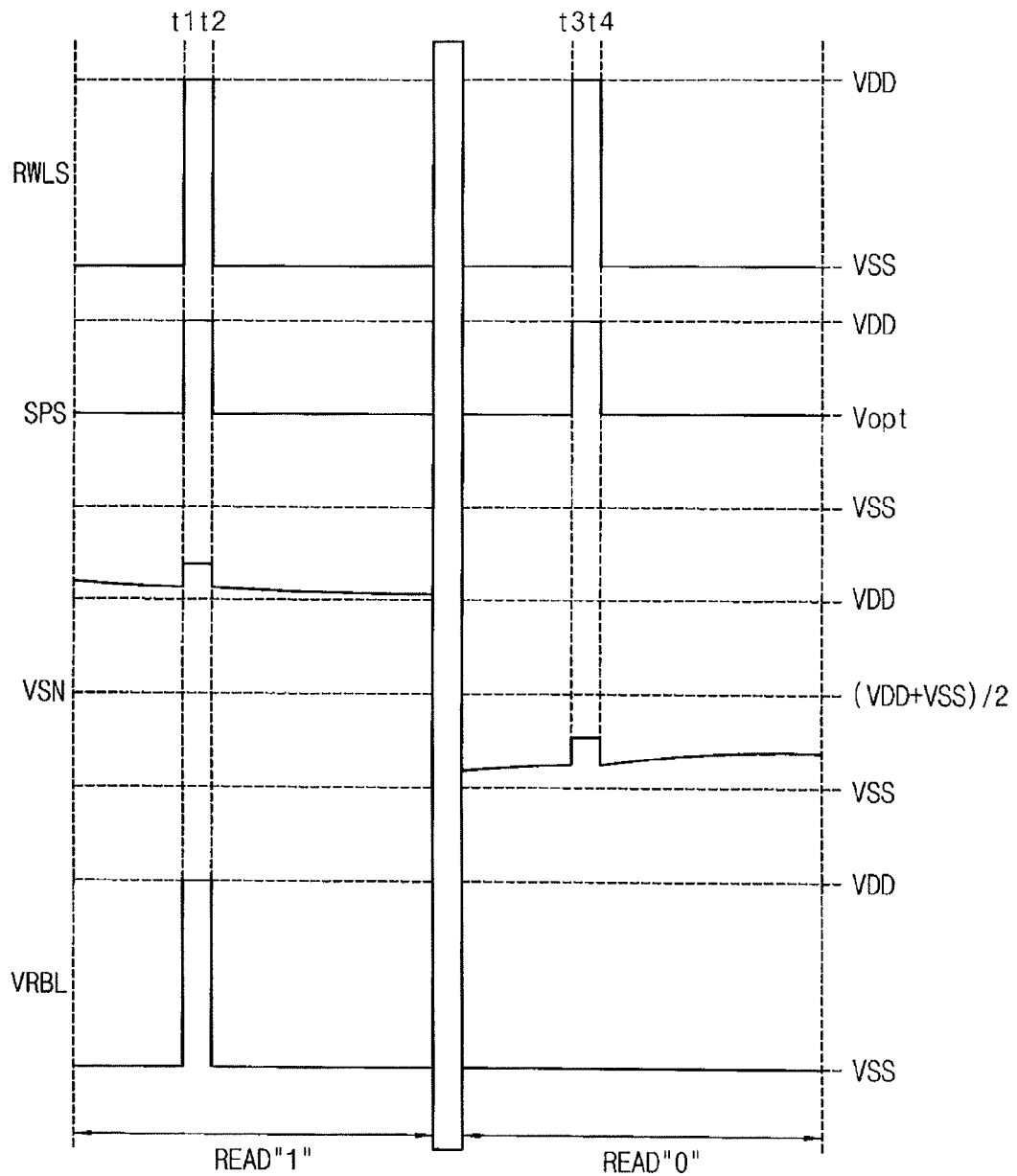
FIG. 16 illustrates a timing diagram for a read operation of the memory cell of FIG. 15.

FIG. 16 illustrates a timing diagram for describing a read operation of the memory cell 300d of FIG. 15. In FIG. 16, a supply voltage VDD represents a logic high level and a ground voltage VSS represents a logic low level. The read operation for reading data "1" is performed at a first time t1 and the read operation for reading data "0" is performed at a third time t3.

As described above with reference to FIG. 10, since the write transistor 310 is implemented with a p-type MOS transistor, the body of the write transistor 310 may be set to the supply voltage VDD. Since the read transistor 345 is implemented with an n-type MOS transistor, the body of the read transistor 345 may be set to the ground voltage VSS. Therefore, the synchronization pulse signal SPS, which is applied to the lower electrode of the MOS capacitor 330 through the synchronization control line SCL, may be kept at an optimum or predetermined voltage Vopt between the supply voltage VDD and the ground voltage VSS in a wait mode before the first time t1 and before the third time t3. This may reduce or minimize a sum of the leakage current flowing between the storage node SN and the body of the write transistor 310 and the leakage current flowing between the storage node SN and the body of the read transistor 345. As such, the data retention time of the memory cell 300d may increase.

As illustrated in FIG. 16, the read bit line RBL may be pre-charged to the logic low level in the read operation. Referring to FIG. 15, if the read word line signal RWLS having the logic low level is applied to the read word line RWL corresponding to a non-selected row, the read switch transistor 355 of the memory cell 300d in the non-selected row may be kept in an off state, such that the read bit line RBL may be disconnected from the read word line RWL. Therefore, the voltage VRBL of the read bit line RBL may not change by the memory cell 300d in the non-selected row.

Therefore, in the read operation of the memory cell 300d according to example embodiments, the read word line signal RWLS activated at the logic high level may be applied to the read word line RWL corresponding to a selected row. The read word line signal RWLS kept at the logic low level may be applied to the read word lines RWL corresponding to non-selected rows.

As described above with reference to FIG. 11, the voltage VSN of the storage node SN may be a sum of the supply voltage VDD and the first coupling voltage Vc1 when data "1" is stored in the storage node SN. At the first time t1, the read word line signal RWLS applied to the read word line RWL corresponding to a selected row of the memory cell array 100 may be activated at the logic high level. The synchronization pulse signal SPS may be activated at the logic high level in synchronization with the read word line signal RWLS. Since the read word line signal RWLS activated at the logic high level is applied to the gate electrode of the read switch transistor 355, the read switch transistor 355 may turn on.

Since a coupling effect may occur at the storage node SN by the MOS capacitor 330 in response to a transition of the synchronization pulse signal SPS from the optimum predetermined voltage Vopt to the logic high level, the voltage VSN of the storage node SN may increase by a small amount. Therefore, the read transistor 345 may also turn on, such that charges may be provided from the read word line RWL to the read bit line RBL through the read transistor 345. Also, the read switch transistor 355 and the voltage VRBL of the read bit line RBL may increase from the pre-charged state, that is, from the logic low level.

Since the synchronization pulse signal SPS activated at the logic high level is applied to the lower electrode of the MOS capacitor 330 at the first time t1, the voltage VSN of the storage node SN may be boosted up from a voltage at a time before the first time t1. Therefore, a current flowing from the read word line RWL to the read bit line RBL through the read transistor 345 and the read switch transistor 355 may be also boosted up. As a result, a sensing margin for the control unit 200 to determine a value of data stored in the memory cell 300d may increase.

Since the read word line signal RWLS having the logic low level is applied to the read word line RWL corresponding to the non-selected row, the read switch transistor 355 of the memory cell 300d included in the non-selected row may be kept in an off state. Therefore, a current may not flow from the read bit line RBL to the read word line RWL through the read switch transistor 355 and the read transistor 345 in the memory cell 300d in the non-selected row, even though the voltage VSN of the storage node SN increases. As such, as illustrated in FIG. 16, the voltage VSN of the storage node SN may increase up to the supply voltage VDD.

The control unit 200 may sense the voltage VRBL of the read bit line RBL which is increased to the logic high level, and determine a value of data stored in the memory cell 300d as "1".

At a second time t2, the read word line signal RWLS may be deactivated at the logic low level and the synchronization pulse signal SPS may be deactivated at the optimum or predetermined voltage Vopt in synchronization with the read word line signal RWLS. Therefore, the voltage VSN of the storage node SN may return to a voltage at a time before the first time t1.

Alternatively, as described above with reference to FIG. 11, the voltage VSN of the storage node SN may be a sum of the ground voltage VSS and the threshold voltage WVth of the write transistor 310 when data "0" is stored in the storage node SN. At the third time t3, the read word line signal RWLS applied to the read word line RWL corresponding to a selected row of the memory cell array 100 may be activated at the logic high level The synchronization pulse signal SPS may be activated at the logic high level in synchronization with the read word line signal RWLS.

Since a coupling effect may occur at the storage node SN by the MOS capacitor 330 in response to a transition of the synchronization pulse signal SPS from the optimum or predetermined voltage Vopt to the logic high level, the voltage VSN of the storage node SN may increase by a small amount. Assuming that characteristics of the read transistor 345 are the same as characteristics of the read switch transistor 355, since the read switch transistor 355 is coupled between the read transistor 345 and the read bit line RBL, the voltage VSN of the storage node SN should be increased up to a voltage, which is higher than an average of the supply voltage VDD and the ground voltage VSS by a threshold voltage of the read transistor 345. As a result, the read transistor 345 may turn on, even though the read word line signal RWLS activated at the logic high level is applied to the gate electrode of the read switch transistor 355.

However, since the voltage VSN of the storage node SN is kept at a low level to store data "0" before the third time t3, the voltage VSN of the storage node SN may not increase above the voltage, which is higher than the average of the supply voltage VDD and the ground voltage VSS by the threshold voltage of the read transistor 345. Therefore, the read transistor 345 may be kept in an off state, even though the read word line signal RWLS activated at the logic high level is applied to the gate electrode of the read switch transistor 355. As a result, the voltage VRBL of the read bit line RBL may be maintained at a pre-charged state, that is, at the logic low level.

The control unit 200 may sense the voltage VRBL of the read bit line RBL which is maintained at the logic low level, and determine a value of data stored in the memory cell 300d as "0".

At a fourth time t4, the read word line signal RWLS may be deactivated at the logic low level and the synchronization pulse signal SPS may be deactivated at the optimum or predetermined voltage Vopt in synchronization with the read word line signal RWLS. Therefore, the voltage VSN of the storage node SN may return to a voltage at a time before the third time t3.

As described above with reference to FIGS. 15 and 16, when reading data "1" from the memory cell 300d, the voltage VSN of the storage node SN may be the supply voltage VDD. When reading data "0" from the memory cell 300d, the voltage VSN of the storage node SN may be the ground voltage VSS. That is, since the memory cell 300d of FIG. 15 further includes the read switch transistor 355, the voltage VSN of the storage node SN may experience a large swing from the supply voltage VDD to the ground voltage VSS, according to a value of data stored in the memory cell 300d. Therefore, a data retention time of the memory cell 300d may further increase.

Referring again to FIG. 1, the control unit 200 may include a row decoder 210, a plurality of write word line drivers WWLD 211, a plurality of read word line driver RWLD 215, a plurality of synchronization control line drivers SCLD 213, a column decoder 220, a write column selection driver WCSD 223, a read column selection driver RCSD 221, a plurality of precharge circuits PCC 225, a plurality of write bit line drivers WBLD 227, and a plurality of sense amplifiers 229.

The row decoder 210 may provide a row selection signal to the plurality of write word line drivers 211, the plurality of read word line driver 215, and the plurality of synchronization control line drivers 213 based on a row address RADDR.

Each of the plurality of write word line drivers 211 may provide the write word line signal WWLS to the memory cells 300 through respective write word lines WWL1, ..., WWLn based on the row selection signal.

Each of the plurality of read word line drivers 215 may provide the read word line signal RWLS to the memory cells 300 through respective read word lines RWL1, ..., RWLn based on the row selection signal.

Each of the plurality of synchronization control line drivers 213 may provide the synchronization pulse signal SPS to the memory cells 300 through respective synchronization control lines SCL1, ..., SCLn based on the row selection signal.

Each of the plurality of pre-charge circuits 225 may pre-charge respective read bit lines RBL1, ..., RBLm to a pre-charge voltage in the read operation.

The column decoder 220 may provide a column selection signal to the write column selection driver 223 based on a column address CADDR in the write operation and provide the column selection signal to the read column selection driver 221 based on the column address CADDR in the read operation.

The write column selection driver 223 may select the plurality of write bit line drivers 227 based on the column selection signal. The read column selection driver 221 may select the plurality of sense amplifiers 229 based on the column selection signal.

In the write operation, the row decoder 210 may select one of the plurality of write word line drivers 211 and one of the plurality of synchronization control line drivers 213 based on the row address RADDR. The selected write word line driver 211 may provide the write word line signal WWLS to the memory cells 300 through the write word line WWL. The selected synchronization control line driver 213 may provide the synchronization pulse signal SPS to the memory cells 300 through the synchronization control line SCL.

In the write operation, the column decoder 220 may control the write column selection driver 223 based on the column address CADDR to select the plurality of write bit line drivers 227.

Write data received through data pads 230 may be provided to the write bit line drivers 227 through global data lines 231 and local data lines 232, and the write bit line drivers 227 may apply the write data to write bit lines WBL1, ..., WBLm. Therefore, the write data may be written into the memory cells 300 coupled to the selected write word line WWL.

Alternatively, in the read operation, the column decoder 220 may control the read column selection driver 221 based on the column address CADDR to select the plurality of sense amplifiers 229. Each of the pre-charge circuits 225 may pre-charge respective read bit lines RBL1, ..., RBLm to the pre-charge voltage.

In addition, in the read operation, the row decoder 210 may select one of the plurality of read word line drivers 215 and one of the plurality of synchronization control line drivers 213 based on the row address RADDR. The selected read word line driver 215 may provide the read word line signal RWLS to the memory cells 300 through the red word line RWL. The selected synchronization control line driver 213 may provide the synchronization pulse signal SPS to the memory cells 300 through the synchronization control line SCL.

Therefore, data stored in the memory cells 300 coupled to the selected read word line RWL may be provided to the sense amplifiers 229 through the read bit lines RBL1, ..., RBLm. The sense amplifiers 229 may determine values of the data stored in the memory cells 300 by comparing signals received through the read bit lines RBL1, ..., RBLm with a reference signal REF. The determined data may be output through the local data lines 232, the global data lines 231, and the data pads 230.

Figure 17:
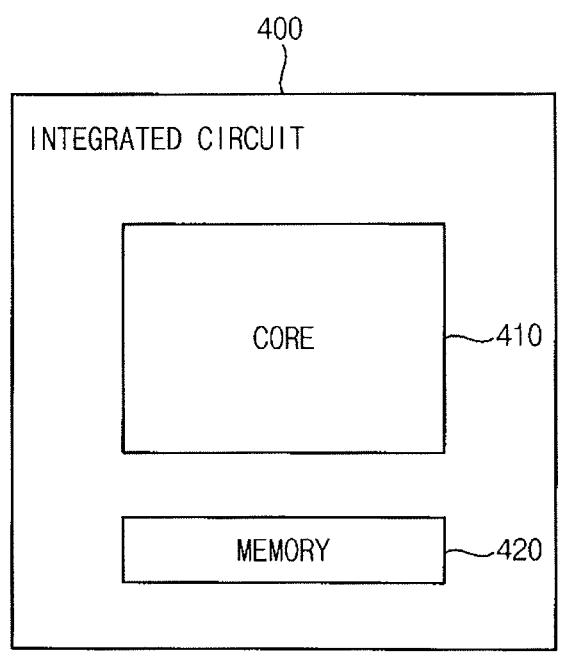
FIG. 17 illustrates an embodiment of an integrated circuit.

FIG. 17 illustrates an embodiment of an integrated circuit 400 which includes a core 410 and a memory device 820. For example, the integrated circuit 400 may be an application processor (AP), a microprocessor, a central processing unit (CPU), an application-specific integrated circuit (ASIC), or the like.

For example, the core 410 may be a logic core that performs a predetermined logic operation, or may be a processor core that fetches an instruction or data and processes the fetched instruction or the fetched data. The core 410 may use the memory device 420 as a cache memory. For example, the core 410 may temporarily store an instruction or data provided from an external memory device in the memory device 420.

Each of memory cells included in the memory device 420 may include a write transistor, a read transistor, and a metal oxide semiconductor (MOS) capacitor. The write transistor may include a gate electrode coupled to a write word line, a first electrode coupled to a write bit line, and a second electrode coupled to a storage node. The read transistor may include a gate electrode coupled to the storage node, a first electrode coupled to a read word line, and a second electrode coupled to a read bit line. The MOS capacitor may include a gate electrode coupled to the storage node and a lower electrode coupled to a synchronization control line.

A synchronization pulse signal may be applied to the lower electrode of the MOS capacitor in synchronization with a write word line signal in a write operation, and may be applied to the lower electrode of the MOS capacitor in synchronization with a read word line signal in a read operation. A coupling effect may therefore occur at the storage node through the MOS capacitor in response to the synchronization pulse signal. As a result, a data retention time of the memory cell in the memory device 420 may increase.

Also, the memory device 420 may have a longer data retention time than a dynamic random access memory (DRAM) and a higher density than a static random access memory (SRAM). The memory device 420 may be embodied with the memory device 10 of FIG. 1.

Figure 18:
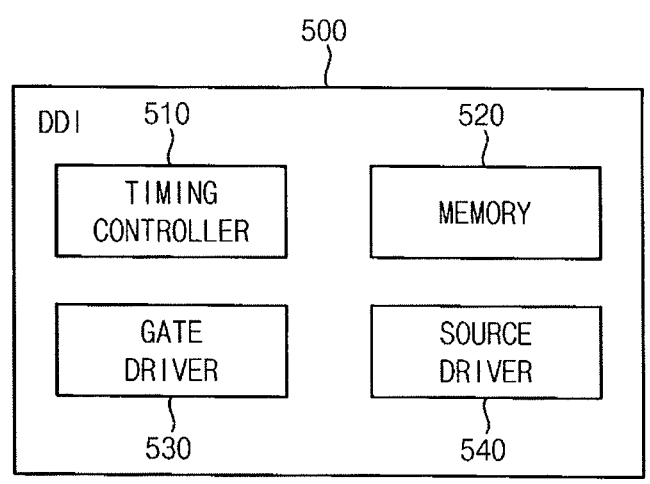
FIG. 18 illustrates an embodiment of a display driver integrated circuit.

FIG. 18 illustrates an embodiment of a display driver integrated 500 which includes a timing controller 510, a memory device 520, a gate driver 530, and a source driver 540. The timing controller 510 may control operations of the gate driver 530 and the source driver 540 in response to a timing signal received from an external host.

The memory device 520 may store image data provided from the external host on a frame basis or on a line basis. The gate driver 530 may turn on pixel transistors (e.g., thin-film transistors (TFTs)) in a display panel (not shown). The source driver 540 may apply a data voltage to pixels in the display panel based on the image data stored in the memory device 520.

Each of memory cells in the memory device 520 may include a write transistor, a read transistor, and a metal oxide semiconductor (MOS) capacitor. The write transistor may include a gate electrode coupled to a write word line, a first electrode coupled to a write bit line, and a second electrode coupled to a storage node. The read transistor may include a gate electrode coupled to the storage node, a first electrode coupled to a read word line, and a second electrode coupled to a read bit line. The MOS capacitor may include a gate electrode coupled to the storage node and a lower electrode coupled to a synchronization control line.

A synchronization pulse signal may be applied to the lower electrode of the MOS capacitor in synchronization with a write word line signal in a write operation, and may be applied to the lower electrode of the MOS capacitor in synchronization with a read word line signal in a read operation. A coupling effect may therefore occur at the storage node through the MOS capacitor in response to the synchronization pulse signal. As a result, a data retention time of the memory cell included in the memory device 520 may increase.

Also, the memory device 520 may have a longer data retention time than a dynamic random access memory (DRAM) and a higher density than a static random access memory (SRAM). The memory device 520 may be embodied with the memory device 10 of FIG. 1.

Figure 19:
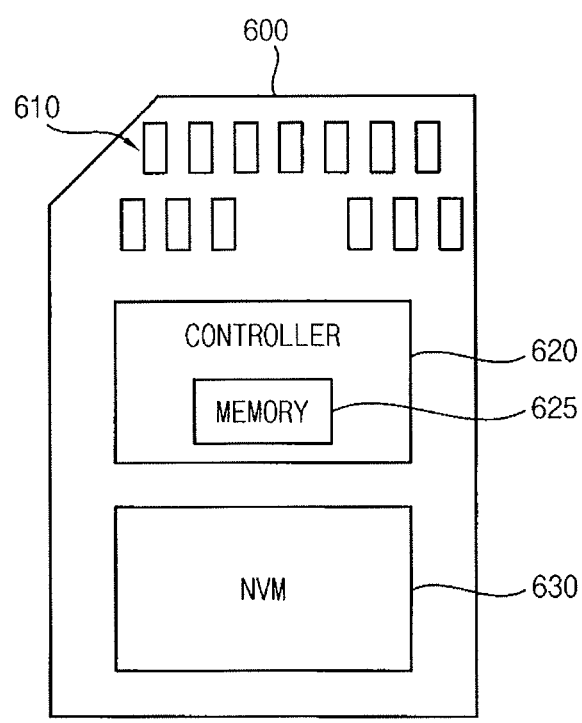
FIG. 19 illustrates an embodiment of a memory card.

FIG. 19 illustrates an embodiment of a memory card 600 which includes a plurality of connection pins 610, a controller 620, a memory device 625, and a nonvolatile memory device NVM 630. According to example embodiments, the memory card 600 may be any type of memory card including, but not limited to, a multimedia card (MMC), a secure digital (SD) card, a micro-SD card, a memory stick, an identification (ID) card, a personal computer memory card international association (PCMCIA) card, a chip card, a universal serial bus (USB) card, a smart card, a compact flash (CF) card, an embedded multimedia card (eMMC), a hybrid embedded multimedia card (hybrid eMMC), etc.

The plurality of connection pins 610 may be coupled to an external host to transmit/receive signals between the external host and the memory card 600. The plurality of connection pins 610 may include a clock pin, a command pin, a data pin, and/or a reset pin. According to example embodiments, the memory card 600 may be attached to any computing system such as a mobile phone, a smart phone, a personal digital assistant (PDA), a portable multimedia player (PMP), a digital camera, a music player, a portable game console, a navigation device, a personal computer (PC), a server computer, a workstation, a tablet computer, a laptop computer, a digital television, a set-top box, etc.

The controller 620 may receive data from the external host and may control the nonvolatile memory device 630 to store the received data. Further, the controller 620 may control the nonvolatile memory device 630 to provide the stored data to the external host. The controller 620 may include the memory device 625 as a buffer memory to temporarily store the data transferred between the external host and the nonvolatile memory device 630. In some embodiments, the memory device 625 may store an address translation table for managing blocks of the nonvolatile memory device 630.

Each of memory cells in the memory device 625 may include a write transistor, a read transistor, and a metal oxide semiconductor (MOS) capacitor. The write transistor may include a gate electrode coupled to a write word line, a first electrode coupled to a write bit line, and a second electrode coupled to a storage node. The read transistor may include a gate electrode coupled to the storage node, a first electrode coupled to a read word line, and a second electrode coupled to a read bit line. The MOS capacitor may include a gate electrode coupled to the storage node and a lower electrode coupled to a synchronization control line.

A synchronization pulse signal may be applied to the lower electrode of the MOS capacitor in synchronization with a write word line signal in a write operation. The synchronization pulse signal may be applied to the lower electrode of the MOS capacitor in synchronization with a read word line signal in a read operation. As a result, a coupling effect may occur at the storage node through the MOS capacitor in response to the synchronization pulse signal. Therefore, a data retention time of the memory cell in the memory device 625 may increase.

In one embodiment, the memory device 625 may have a longer data retention time than a dynamic random access memory (DRAM) and a higher density than a static random access memory (SRAM). The memory device 625 may be embodied with the memory device 10 of FIG. 1.

Figure 20:
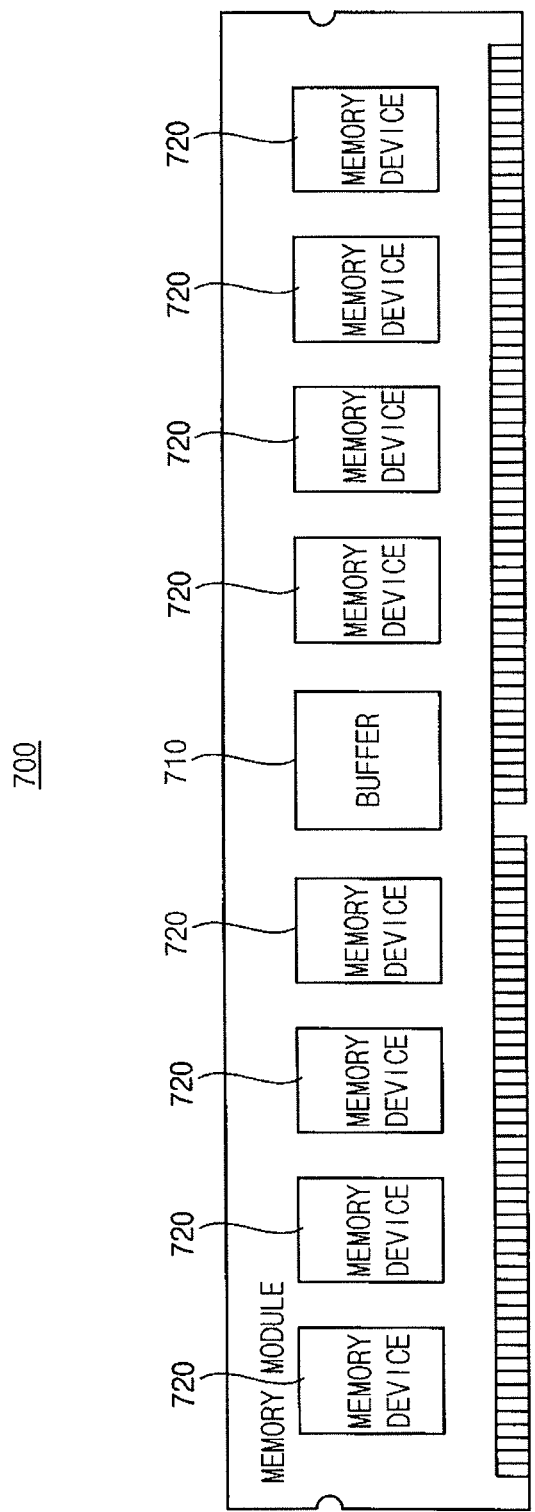
FIG. 20 illustrates an embodiment of a memory module.

FIG. 20 illustrates an embodiment of a memory module 700 which may include a plurality of memory devices 720. The memory module 700 may be, for example, an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 700 may further include a buffer 710 that receives a command signal, an address signal, and data from a memory controller through a plurality of transmission lines. The memory module 700 may buffer the command signal, the address signal, and the data to provide the plurality of memory devices 720 with the command signal, the address signal and the data.

In some example embodiments, data transmission lines between the buffer 710 and the plurality of memory devices 720 may be coupled in a point-to-point topology. Command transmission lines and address transmission lines between the buffer 710 and the plurality of memory devices 720 may be coupled, for example, in a multi-drop topology, a daisy-chain topology, a fly-by daisy-chain topology, or the like. Since the buffer 710 buffers the command signal, the address signal and the data, the memory controller may interface with the memory module 700 by driving only a load of the buffer 710. Accordingly, the memory module 700 may include more memory devices 720 and/or more memory ranks, and a memory system may include more memory modules 700.

Each of memory cells included in the memory device 720 may include a write transistor, a read transistor, and a metal oxide semiconductor (MOS) capacitor. The write transistor may include a gate electrode coupled to a write word line, a first electrode coupled to a write bit line, and a second electrode coupled to a storage node. The read transistor may include a gate electrode coupled to the storage node, a first electrode coupled to a read word line, and a second electrode coupled to a read bit line. The MOS capacitor may include a gate electrode coupled to the storage node and a lower electrode coupled to a synchronization control line. A synchronization pulse signal may be applied to the lower electrode of the MOS capacitor in synchronization with a write word line signal in a write operation, and also may be applied to the lower electrode of the MOS capacitor in synchronization with a read word line signal in a read operation. As a result, a coupling effect may occur at the storage node through the MOS capacitor in response to the synchronization pulse signal. Therefore, a data retention time of the memory cell included in the memory device 720 may increase.

The memory device 720 may have a longer data retention time than a dynamic random access memory (DRAM) and a higher density than a static random access memory (SRAM). The memory device 720 may be embodied with the memory device 10 of FIG. 1.

Figure 21:
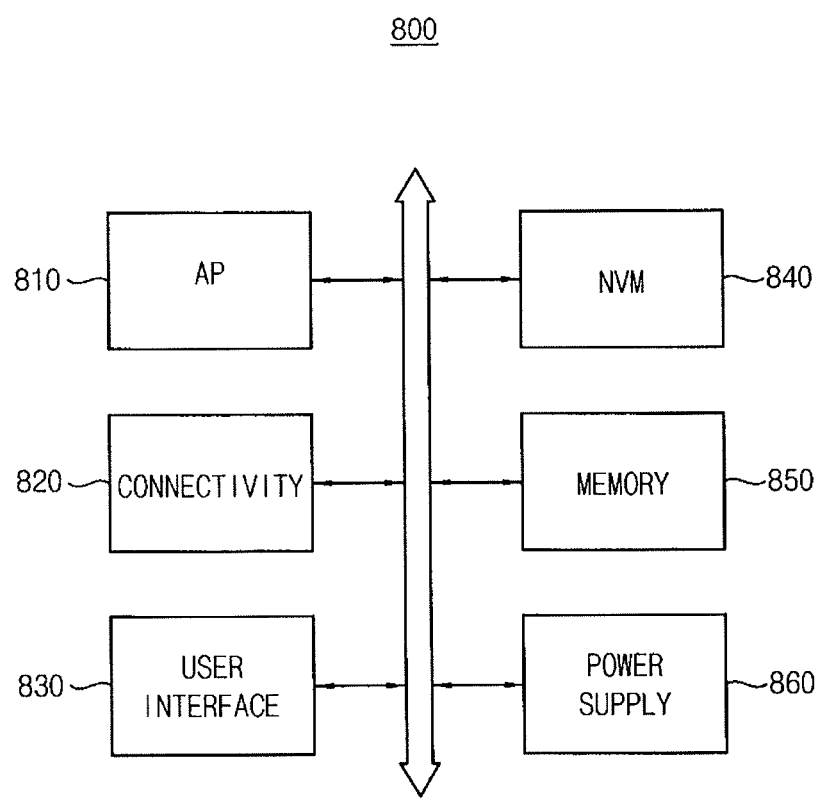
FIG. 21 illustrates an embodiment of a mobile system.

FIG. 21 illustrates an embodiment of a mobile system 800 which includes an application processor 810, a connectivity unit 820, a user interface 830, a nonvolatile memory device NVM 840, a memory device 850, and a power supply 860. The mobile system 800 may be, for example, a mobile phone, a smart phone, a personal digital assistant (PDA), a portable multimedia player (PMP), a digital camera, a music player, a portable game console, a navigation system, etc.

The application processor 810 may execute applications such as a web browser, a game application, a video player, etc. The application processor 810 may include a single core or multiple cores. For example, the application processor 810 may be a multi-core processor such as a dual-core processor, a quad-core processor, a hexa-core processor, etc. The application processor 810 may also include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The memory device 850 may store data processed by the application processor 810, or may operate as a working memory. Each of memory cells in the memory device 850 may include a write transistor, a read transistor, and a metal oxide semiconductor (MOS) capacitor. The write transistor may include a gate electrode coupled to a write word line, a first electrode coupled to a write bit line, and a second electrode coupled to a storage node. The read transistor may include a gate electrode coupled to the storage node, a first electrode coupled to a read word line, and a second electrode coupled to a read bit line. The MOS capacitor may include a gate electrode coupled to the storage node and a lower electrode coupled to a synchronization control line.

A synchronization pulse signal may be applied to the lower electrode of the MOS capacitor in synchronization with a write word line signal in a write operation, and may be applied to the lower electrode of the MOS capacitor in synchronization with a read word line signal in a read operation. As a result, a coupling effect may occur at the storage node through the MOS capacitor in response to the synchronization pulse signal. Therefore, a data retention time of the memory cell included in the memory device 850 may increase.

The memory device 850 may have a longer data retention time than a dynamic random access memory (DRAM) and a higher density than a static random access memory (SRAM). The memory device 850 may be embodied with the memory device 10 of FIG. 1.

In one embodiment, the nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device such as a keypad, a touch screen, etc., and at least one output device, such as a speaker, a display device, etc. The power supply 860 may supply a power supply voltage to the mobile system 800.

In some embodiments, the mobile system 800 may include an image processor, and/or a storage device such as a memory card, a solid state drive (SSD), a hard disk drive (HDD), a CD-ROM, etc.

In some embodiments, the mobile system 800 and/or components of the mobile system 800 may be packaged in various forms such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 22:
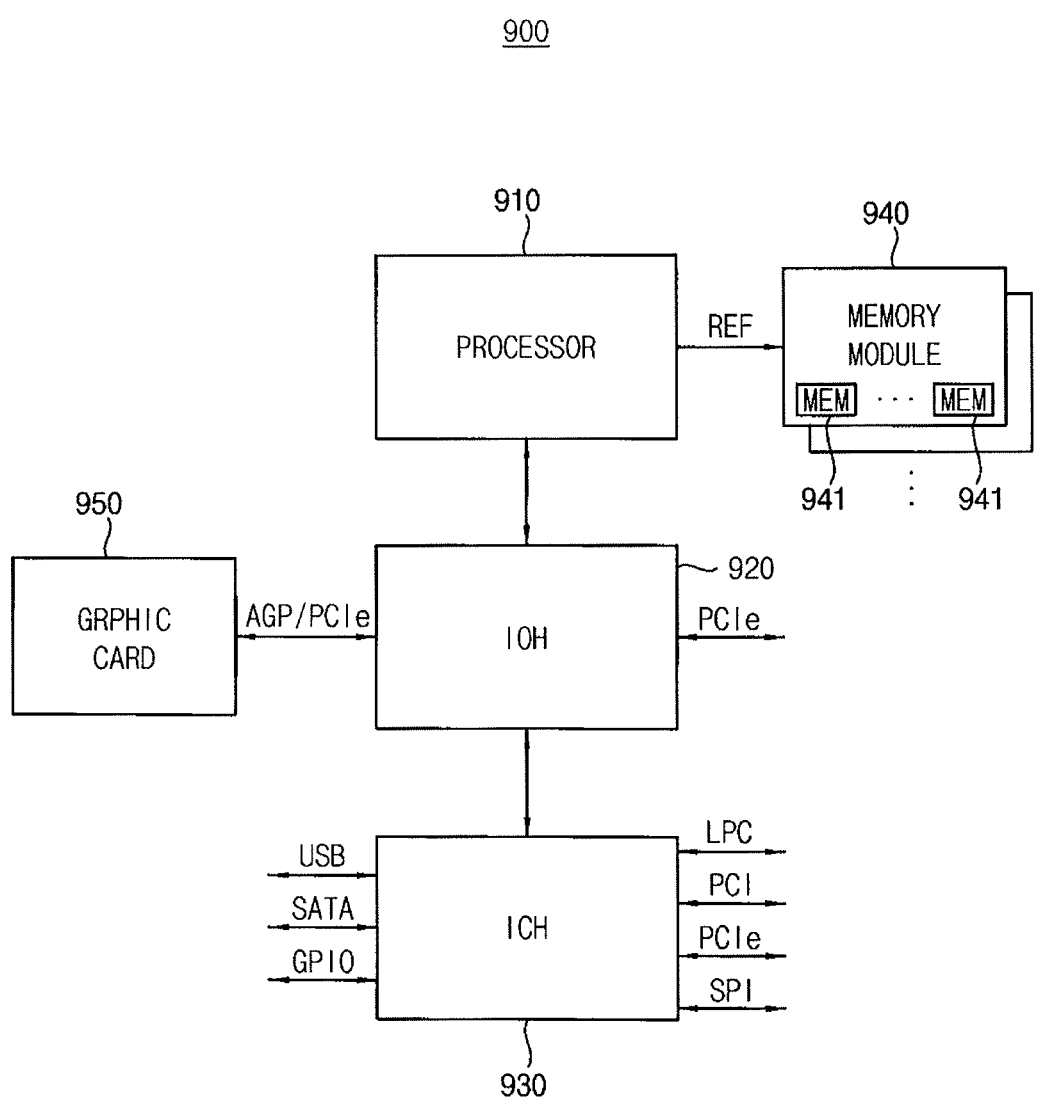
FIG. 22 illustrates an embodiment of a computing system.

FIG. 22 illustrates an embodiment of a computing system 900 which includes a processor 910, an input/output hub (IOH) 920, an input/output controller hub (ICH) 930, at least one memory module 940, and a graphics card 950. In some embodiments, the computing system 900 may be a personal computer (PC), a server computer, a workstation, a laptop computer, a mobile phone, a smart phone, a personal digital assistant (PDA), a portable multimedia player (PMP), a digital camera, a digital television, a set-top box, a music player, portable game console, navigation system, etc.

The processor 910 may perform various computing functions, such as executing specific software for performing specific calculations or tasks. For example, the processor 910 may be a microprocessor, a central process unit (CPU), a digital signal processor, or the like. The processor 910 may include a single core or multiple cores. For example, the processor 910 may be a multi-core processor such as a dual-core processor, a quad-core processor, a hexa-core processor, etc. Although FIG. 22 illustrates the computing system 900 including one processor 910, in some embodiments, the computing system 900 may include a plurality of processors.

The processor 910 may include a memory controller for controlling operations of the memory module 940. The memory controller included in the processor 910 may be referred to as an integrated memory controller (IMC). A memory interface between the memory controller and the memory module 940 may be implemented with a single channel including a plurality of signal lines, or may bay be implemented with multiple channels, to each of which at least one memory module 940 may be coupled. In some embodiments, the memory controller may be located inside the input/output hub 920. The input/output hub 920 including the memory controller may be referred to as memory controller hub (MCH).

The memory module 940 may include a plurality of memory devices MEM 941 that store data provided from the memory controller. Each of memory cells in the memory device 941 may include a write transistor, a read transistor, and a metal oxide semiconductor (MOS) capacitor. The write transistor may include a gate electrode coupled to a write word line, a first electrode coupled to a write bit line, and a second electrode coupled to a storage node. The read transistor may include a gate electrode coupled to the storage node, a first electrode coupled to a read word line, and a second electrode coupled to a read bit line. The MOS capacitor may include a gate electrode coupled to the storage node and a lower electrode coupled to a synchronization control line.

A synchronization pulse signal may be applied to the lower electrode of the MOS capacitor in synchronization with a write word line signal in a write operation, and also may be applied to the lower electrode of the MOS capacitor in synchronization with a read word line signal in a read operation. As a result, a coupling effect may occur at the storage node through the MOS capacitor in response to the synchronization pulse signal. Therefore, a data retention time of the memory cell included in the memory device 941 may increase.

The memory device 941 may have a longer data retention time than a dynamic random access memory (DRAM) and a higher density than a static random access memory (SRAM). The memory device 941 may be embodied with the memory device 10 of FIG. 1.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 22 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory cell, comprising:
    a write transistor including a gate electrode coupled to a write word line, a first electrode coupled to a write bit line, and a second electrode coupled to a storage node;
    a read transistor including a gate electrode coupled to the storage node, a first electrode directly coupled to a read word line, and a second electrode directly coupled to a read bit line; and
    a metal oxide semiconductor (MOS) capacitor including a first electrode coupled to the storage node and a second electrode coupled to a synchronization control line, the second electrode coupled to receive a synchronization pulse signal through the synchronization control line.

2. The memory cell as claimed in claim 1, wherein the synchronization pulse signal is applied to the synchronization control line in a write operation.

3. The memory cell as claimed in claim 2, wherein the synchronization pulse signal is applied to the synchronization control line in synchronization with a write word line signal applied to the write word line.

4. The memory cell as claimed in claim 1, wherein the synchronization pulse signal is applied to the synchronization control line in a read operation.

5. The memory cell as claimed in claim 4, wherein the synchronization pulse signal is applied to the synchronization control line in synchronization with a read word line signal applied to the read word line.

6. The memory cell as claimed in claim 1, wherein the write transistor and the read transistor are p-type MOS transistors.

7. The memory cell as claimed in claim 6, wherein, in a write operation:
a write word line signal activated at a logic low level is applied to the write word line and the synchronization pulse signal is activated at the logic low level in synchronization with the write word line signal.

8. The memory cell as claimed in claim 6, wherein, in a read operation:
a read word line signal activated at a logic high level is applied to the read word line and the synchronization pulse signal is activated at a logic low level in synchronization with the read word line signal.

9. The memory cell as claimed in claim 1, wherein the write transistor is a p-type MOS transistor and the read transistor is an n-type MOS transistor.

10. The memory cell as claimed in claim 9, wherein, in a write operation:
a write word line signal activated at a logic low level is applied to the write word line, and the synchronization pulse signal is:
a) maintained at a first level between a logic high level and the logic low level before the write word line signal is activated at the logic low level, and
b) activated at the logic low level in synchronization with the write word line signal.

11. The memory cell as claimed in claim 9, wherein, in a write operation:
a write word line signal activated at a logic low level is applied to the write word line, and the synchronization pulse signal is:
a) maintained at a first level between a logic high level and the logic low level,
b) changed to the logic high level before the write word line signal is activated at the logic low level, and
c) activated at the logic low level in synchronization with the write word line signal.

12. The memory cell as claimed in claim 9, wherein, in a read operation:
a read word line signal activated at a logic low level is applied to the read word line, and the synchronization pulse signal is:
a) maintained at a first level between a logic high level and the logic low level before the read word line signal is activated at the logic low level, and
b) activated at the logic high level in synchronization with the read word line signal.

13. The memory cell as claimed in claim 1, wherein the MOS capacitor includes one impurity region in a first direction along an edge of the memory cell, the one impurity region corresponding to the second electrode.

14. The memory cell as claimed in claim 13, wherein:
the gate electrode of the read transistor and the first electrode of the MOS capacitor are integrally formed as one common electrode, and
the one common electrode includes a region that overlaps the one impurity region along the first direction.

15. The memory cell as claimed in claim 14, wherein the one common electrode is electrically connected to the second electrode of the write transistor through a shared contact.

* * * * *